United States Patent
Sato

(10) Patent No.: US 8,083,891 B2
(45) Date of Patent: Dec. 27, 2011

(54) PLASMA PROCESSING APPARATUS AND THE UPPER ELECTRODE UNIT

(75) Inventor: Tetsuji Sato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/894,803

(22) Filed: Sep. 30, 2010

(65) Prior Publication Data

US 2011/0030898 A1 Feb. 10, 2011

Related U.S. Application Data

(60) Continuation of application No. 12/405,432, filed on Mar. 17, 2009, now abandoned, which is a division of application No. 10/830,355, filed on Apr. 23, 2004, now abandoned.

(30) Foreign Application Priority Data

| Apr. 25, 2003 | (JP) | 2003-121214 |
| May 30, 2003 | (JP) | 2003-154844 |
| Sep. 19, 2003 | (JP) | 2003-327186 |

(51) Int. Cl.
- H01L 21/3065 (2006.01)
- C23C 16/00 (2006.01)
- C23C 16/455 (2006.01)
- C23C 16/50 (2006.01)

(52) U.S. Cl. ......... 156/345.47; 156/345.33; 156/345.34; 156/345.43; 118/723 E; 118/715

(58) Field of Classification Search ............... 118/715, 118/723 E, 729; 156/345.33, 345.34, 345.43, 156/345.47, 345.54

See application file for complete search history.

(56) References Cited

U.S. PATENT DOCUMENTS

| 4,931,135 A | * | 6/1990 | Horiuchi et al. | 216/67 |
| 4,964,940 A | * | 10/1990 | Auvert et al. | 156/345.5 |
| 5,084,125 A | * | 1/1992 | Aoi | 156/345.31 |
| 5,110,437 A | * | 5/1992 | Yamada et al. | 204/298.33 |
| 5,354,413 A | * | 10/1994 | Smesny et al. | 156/345.47 |
| 5,589,002 A | | 12/1996 | Su | |
| 5,599,513 A | | 2/1997 | Masaki et al. | |

(Continued)

FOREIGN PATENT DOCUMENTS

JP 03127822 A * 5/1991

(Continued)

OTHER PUBLICATIONS

Office Action dated Jul. 28, 2009, issued in corresponding JP Patent Application No. 2003-327186.

*Primary Examiner* — Jeffrie R Lund

(74) *Attorney, Agent, or Firm* — Finnegan Henderson Farabow Garrett & Dunner, L.L.P.

(57) ABSTRACT

In a plasma processing apparatus that executes plasma processing on a semiconductor wafer placed inside a processing chamber by generating plasma with a processing gas supplied through a gas supply hole at an upper electrode (shower head) disposed inside the processing chamber, an interchangeable insert member is inserted at a gas passing hole at a gas supply unit to prevent entry of charged particles in the plasma generated in the processing chamber into the gas supply unit. This structure makes it possible to fully prevent the entry of charged particles in the plasma generated inside the processing chamber into the gas supply unit.

13 Claims, 18 Drawing Sheets

U.S. PATENT DOCUMENTS

| | | | |
|---|---|---|---|
| 5,746,875 | A | 5/1998 | Maydan et al. |
| 5,853,607 | A * | 12/1998 | Zhao et al. .................. 252/8 |
| 5,879,461 | A * | 3/1999 | Adams ....................... 118/724 |
| 5,904,487 | A * | 5/1999 | Conboy et al. ............... 438/14 |
| 6,113,734 | A | 9/2000 | Woo et al. |
| 6,231,716 | B1 * | 5/2001 | White et al. ............. 156/345.54 |
| 6,350,317 | B1 * | 2/2002 | Hao et al. ................... 118/71 |
| 6,432,259 | B1 | 8/2002 | Noorbakhsh et al. |
| 6,474,570 | B2 | 11/2002 | Chen |
| 6,502,530 | B1 | 1/2003 | Turlot et al. |
| 6,669,811 | B2 * | 12/2003 | Hao et al. .................. 156/345.3 |
| RE41,266 | E * | 4/2010 | Degner et al. ................ 228/121 |
| 7,815,767 | B2 * | 10/2010 | Sato ....................... 156/345.47 |
| 2002/0100555 | A1 * | 8/2002 | Hao et al. ................. 156/345.33 |
| 2003/0024900 | A1 * | 2/2003 | Johnson ..................... 216/59 |
| 2003/0037880 | A1 | 2/2003 | Carducci et al. |
| 2003/0042227 | A1 * | 3/2003 | Fink ......................... 216/63 |
| 2003/0111961 | A1 | 6/2003 | Katz et al. |
| 2004/0026372 | A1 * | 2/2004 | Takenaka et al. ............. 216/71 |
| 2004/0140054 | A1 * | 7/2004 | Johnson .................. 156/345.43 |
| 2004/0182515 | A1 * | 9/2004 | Sato ....................... 156/345.43 |
| 2004/0211519 | A1 * | 10/2004 | Fink ...................... 156/345.51 |
| 2004/0250770 | A1 * | 12/2004 | Nakano et al. ............. 118/723 E |
| 2004/0261712 | A1 | 12/2004 | Hayashi et al. |
| 2005/0051520 | A1 * | 3/2005 | Tanaka ..................... 219/121.43 |
| 2005/0066902 | A1 * | 3/2005 | Fink ....................... 118/729 |
| 2005/0109460 | A1 | 5/2005 | DeDontney et al. |
| 2005/0145181 | A1 * | 7/2005 | Dickinson .................. 118/729 |
| 2005/0173569 | A1 | 8/2005 | Noorbakhsh et al. |
| 2006/0207630 | A1 * | 9/2006 | Sakai et al. ................. 134/1.1 |
| 2008/0061034 | A1 * | 3/2008 | Junn et al. ................... 216/60 |
| 2008/0295771 | A1 * | 12/2008 | Chiang et al. .............. 118/712 |
| 2009/0068849 | A1 * | 3/2009 | Endo et al. ................. 438/763 |
| 2009/0098736 | A1 * | 4/2009 | Iijima et al. ............... 438/720 |
| 2009/0120364 | A1 * | 5/2009 | Suarez et al. ............... 118/715 |
| 2009/0217871 | A1 * | 9/2009 | Kim et al. .................. 118/663 |
| 2009/0255631 | A1 | 10/2009 | Sato |
| 2011/0030898 | A1 * | 2/2011 | Sato ....................... 156/345.24 |

FOREIGN PATENT DOCUMENTS

JP      09-275093      10/1997

* cited by examiner

PLASMA PROCESSING APPARATUS AND THE UPPER ELECTRODE UNIT

CROSS-REFERENCE TO RELATED APPLICATIONS

This application is a continuation application of application Ser. No. 12/405,432, filed Mar. 17, 2009, now abandoned, of Tetsuji SATO for PLASMA PROCESSING APPARATUS AND THE UPPER ELECTRODE UNIT, which is a divisional of application Ser. No. 10/830,355, filed Apr. 23, 2004, now abandoned, of Daisuke HAYASHI et al. for PLASMA PROCESSING APPARATUS, the entireties of which are incorporated herein by reference.

BACKGROUND OF THE INVENTION

1. Field of the Invention

The present invention relates to a plasma processing apparatus, and more specifically, it relates to a plasma processing apparatus that does not allow charged particles of plasma generated in a processing chamber to enter a gas supply unit.

2. Description of the Related Art

Plaza processing apparatuses in the known art include those that execute plasma processing such as etching on the work surface of a workpiece, e.g., a semiconductor wafer (hereafter simply referred to as a "wafer") placed within a processing chamber by, for instance, supplying a processing gas from a gas supply unit into the processing chamber and generating plasma with the processing gas.

The gas supply unit in such a plasma processing apparatus is constituted as a shower head having numerous gas supply holes through which the processing gas is supplied into the processing chamber. The plasma processing apparatus may be, for instance, a plane parallel plasma processing apparatus having a lower electrode disposed within the processing chamber, on which the workpiece is placed. The gas supply unit is constituted of a shower head also functioning as an upper electrode which is disposed at the ceiling of the processing chamber so as to face opposite the lower electrode.

The gas supply unit includes an electrode plate that constitutes the lower surface thereof, in which numerous gas supply holes are formed and an electrode support body supporting the electrode plate. Inside the electrode support body, a buffer chamber is formed as a space located above the electrode plate and communicating with a gas supply pipe, and the buffer chamber also communicates with the gas supply holes at the electrode plate. The gas flowing in through the gas supply pipe is first supplied into the buffer chamber and is then guided from the buffer chamber into the processing chamber via the gas supply holes at the electrode plate.

However, charged particles such as electrons and ions in the plasma generated with the processing gases inside the processing chamber may enter the buffer chamber through the gas supply holes at the gas supply unit in the plasma processing apparatus. If charged particles in the plasma enter the gas supply unit (shower head), a glow discharge occurs in the buffer chamber at the gas supply unit, giving rise to problems such as reaction products becoming adhered to the inner surfaces of the gas supply unit and the inner surfaces of the gas supply unit becoming corroded.

These problems are addressed in, for instance, Japanese Patent Laid-open Publication No. 9-275093, which discloses a structure achieved by mounting a screw having a hole decentered from the central axis at each gas outlet hole of the gas supply means so that there is no clear passage from one opening end of the gas supply hole through the other opening end to prevent entry of electrons and ions in the plasma into the gas supply means. This technology was developed in order to minimize the entry of charged particles through the mean free path based upon the concept that the charged particles in the plasma are allowed to enter the gas supply means since the thickness of the electrode plate (the height of the gas supply holes) is approximately equal to the length of the mean free path of the charged particles in the plasma.

However, the charged particles in the plasma enter the gas supply means not only through the mean free path but also because of other factors. For instance, the potential (the ground potential) at the electrode support body constituting the upper wall of the buffer chamber in the gas supply unit may become lower than the potential (ground potential) at the electrode plate constituting the lower wall of the buffer chamber. In such an event, the charged particles in the plasma are allowed to readily enter the buffer chamber from the gas supply holes at the electrode plate toward the electrode support body. In addition, while the gas supply unit normally maintains a field free state inside, the equipotential line will become skewed at an end of a gas supply hole and shifts into the gas supply hole if the gas supply hole is clear, thereby allowing a concentration of energy of the electrons and the like and allowing the electrons and the like to readily enter the gas supply hole.

For this reason, charged particles in the plasma cannot be fully prevented from entering the gas supply means simply by mounting a screw having a hole decentered from the central axis at each gas outlet hole of the gas supply means as disclosed in Japanese Patent Laid-open Publication No. 9-275093. For instance, since high-frequency power causes charged particles such as electrons to vibrate along a direction perpendicular to the equipotential line, the oscillating direction of the charged particles becomes tilted if the equipotential line becomes skewed and shifts into the end portion of the gas supply hole. In such a case, the entry of the charged particles cannot be fully prevented simply by mounting a screw having a hole decentered from the central axis.

Furthermore, entry of the charged particles in the plasma is most likely to occur when various conditions such as a specific gas supply hole diameter, a specific gas type and a specific plasma density coincide. This leads to a concept that if the gas passage at the gas supply hole can be altered in correspondence to predetermined conditions, the entry of the charged particles in the plasma into the gas supply unit can be prevented more effectively.

Accordingly, an object of the present invention, which has been completed by addressing the problems discussed above, is to provide a plasma processing apparatus capable of fully preventing charged particles in the plaza generated inside the processing chamber from entering the gas supply unit.

SUMMARY OF THE INVENTION

In order to achieve the object described above, in an aspect of the present invention, a plasma processing apparatus that executes plasma processing on a workpiece placed inside a processing chamber by generating plasma with a processing gas supplied through gas supply holes of gas supply unit disposed inside the processing chamber, characterized in that an interchangeable insert member, which prevents charged particles in the plasma generated inside the processing chamber from entering the gas supply unit, is mounted at each gas supply hole at the gas supply unit, is provided.

The insert member may include a gas passage communicating between the entry side and the exit side of the gas supply hole, and the gas passage may include a passage which extends along a direction perpendicular to or at an angle to a central axis of the gas supply hole so as to regulate the flow along the central axis.

Alternately, the insert member may include a gas passage formed, for instance, as a spiral gas passage, which communicates between the entry side and the exit side of the gas supply hole while constantly regulating the flow in the gas supply hole along the central axis. Such a gas passage may be formed so that its section has a width (groove depth) along the direction perpendicular to the central axis of the gas supply hole larger than the thickness of the passage along the central axis of the gas supply hole.

In addition, an insert member constituted of a specific material may be used in conjunction with a specific gas type used for the plasma processing. Furthermore, the shape of the gas passage in the insert member may be determined in correspondence to the density of the plasma generated in the processing chamber.

Even if charged particles such as electrons in the plasma enter through the gas supply hole the flow of the charged particles inside the gas supply hole is regulated along the central axis and the charged particles are thus caused to collide into the inner wall or the like of the insert member and lose energy before they reach the upper end of the insert member in the plasma processing apparatus according to the present invention described above. In particular, even if the equipotential line becomes skewed at the end of the gas supply hole, the oscillating direction of the charged particles such as electrons becomes tilted and, as a result, the charged particles enter the gas supply hole, the movement of the charged particles along the central axis is regulated through the gas passage. Thus, the entry of the charged particles in the plasma into the gas supply unit can be prevented with a high degree of reliability. This, in turn, effectively prevents any occurrence of a glow discharge in the gas supply unit since no energy is transferred into the gas supply unit.

Moreover, since interchangeable insert members are used according to the present invention, optimal insert members can be mounted at the gas supply unit in correspondence to various conditions such as the specific gas type and the specific plasma density.

DETAILED DESCRIPTION OF THE PREFERRED EMBODIMENTS

Figure 1:
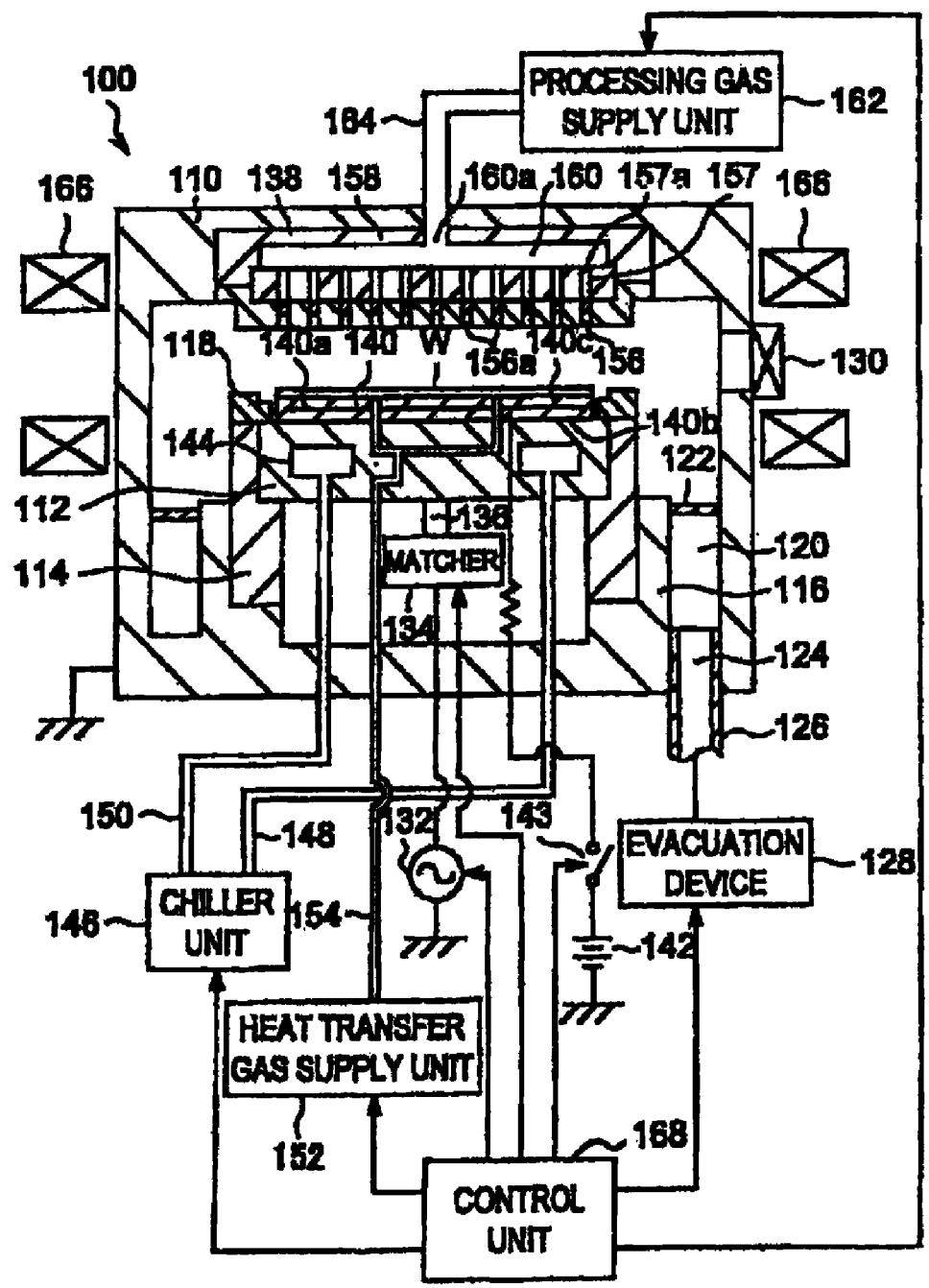
FIG. 1 is a schematic sectional view of the structure adopted in an etching apparatus in an embodiment of the present invention.

The following is a detailed explanation of the preferred embodiments of the present invention, given in reference to the attached drawings. It is to be noted that the same reference numerals are assigned to components having substantially identical functions and structural features in the specification and drawings to preclude the necessity for a repeated explanation thereof.

(Plasma Processing Apparatus Achieved in an Embodiment of the Present Invention)

The structure adopted in the plasma processing apparatus achieved in an embodiment of the present invention is now explained in reference to FIG. 1. FIG. 1 is a sectional view of the structure of a plasma processing apparatus achieved in the embodiment. A plasma processing apparatus 100, which is an RIE plasma etching apparatus, includes a cylindrical processing chamber (chamber) 110 constituted of a metal such as aluminum or stainless steel. The processing chamber 110 is grounded for protection.

Inside the processing chamber 110, a disk-shaped lower electrode (susceptor) 112, on which a workpiece such as a semiconductor wafer (hereafter simply referred to as a wafer) is placed, is disposed. The lower electrode 112 constituted of, for instance, aluminum is supported by a barrel-shaped supporting unit 116 extending upward perpendicular to the bottom of the processing chamber 110 via an insulating barrel-shaped holding unit 114. At the upper surface of the barrel-shaped holding unit 114, a focus ring 118 constituted of, for instance, quartz, which encircles the upper surface of the lower electrode 112, is disposed.

An evacuating passage 120 is formed between the side wall of the processing chamber 110 and the barrel-shaped supporting unit 116. An annular baffle plate 122 is mounted either at the entrance to or in the middle of the evacuating passage 120, and an evacuation port 124 is provided at the bottom of the evacuating passage 120. An evacuation device 128 is connected to the evacuation port 124 via an evacuation pipe 126. The evacuation device 128, which includes a vacuum pump (not shown), is capable of reducing the pressure in the processing space within the processing chamber 110 to a predetermined degree of vacuum. A gate valve 130, which opens/closes the delivery bay through which the wafer W is carried in/out is mounted at the side wall of the processing chamber 110.

A high-frequency source 132 for plasma generation and also for RIE is electrically connected to the lower electrode 112 via a matcher 134 and a power supply rod 136. High-frequency power with a predetermined frequency, e.g., 60 MHz, is applied to the lower electrode 112 from the high-frequency source 132. In addition, at the ceiling of the processing chamber 110, a shower head (hereafter referred an "upper electrode") 138 to be detailed later, which is used to supply a processing gas and also functions as an upper electrode, is disposed at a position facing opposite the lower electrode 112. The potential at the upper electrode 138 is set to ground level. Thus, the high-frequency voltage from the high-frequency source 132 is capacitatively applied between the lower electrode 112 and the upper electrode 138.

An electrostatic chuck 140 that holds the wafer W by electrostatically attracting the wafer W is provided at the upper surface of the lower electrode 112. The electrostatic chuck 140 is constituted by enclosing an electrode 140a formed from a conductive film between a pair of insulating films 140b and 140c. A DC source 142 is electrically connected with the electrode 140a via a switch 143. As a DC voltage is supplied from the DC source 142, the wafer W is attracted and held onto the electrostatic chuck 140 with the resulting coulomb force.

A coolant chamber 144, which may extend along, for instance, the circumferential direction is provided inside the lower electrode 112. A coolant such as cooling water sustaining a predetermined temperature and supplied from a chiller unit 146 via pipings 148 and 150 circulates through the coolant chamber 144. The temperature of the wafer W on the lower electrode 112 can be controlled in correspondence to the temperature of the coolant. In addition, a heat transfer gas such as an He gas is supplied from a heat transfer gas supply unit 152 via a gas supply line 154 to the space between the upper surface of the electrostatic chuck 140 and the back surface of the wafer W.

Figure 2:
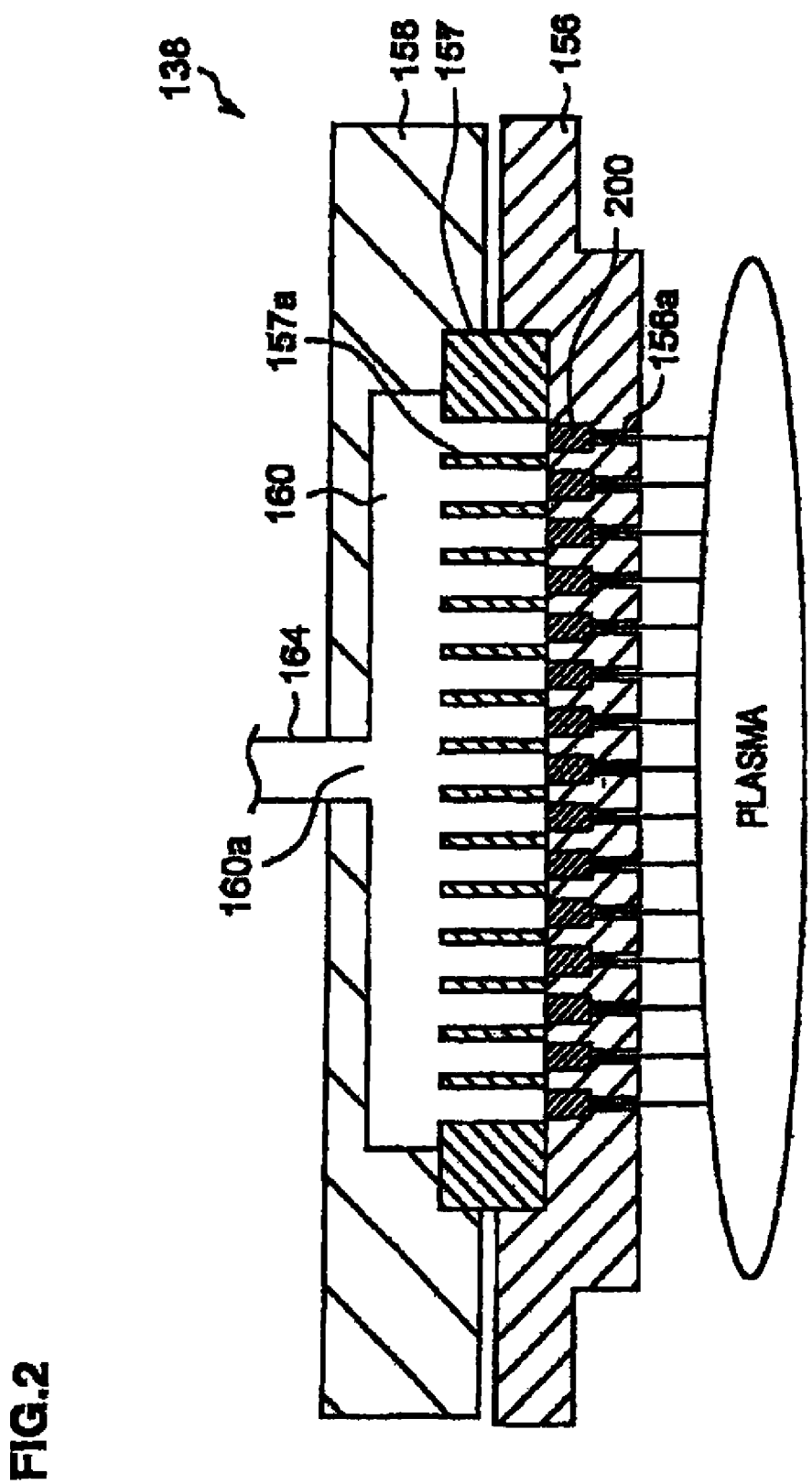
FIG. 2 is a schematic sectional view of the structure adopted in the upper electrode (shower head) in the embodiment.

As FIG. 2 also shows, the upper electrode (shower head) 138 includes an electrode plate 156 located on the lower side, at which numerous gas passing holes 156a are formed, an electrode support body 158 which detachably supports the electrode plate 156 and an intermediate member 157 disposed on top of the electrode plate 156 and having gas communicating holes 157a each communicating with one of the gas passing holes 156a at the electrode plate 156. The gas supply holes at the gas supply unit according to the present invention are each constituted with a gas passing hole 156a and the corresponding gas communicating hole 157a described above. Inside the electrode support body 158, a buffer chamber 160 is formed and a gas supply piping 164 extending from a processing gas supply unit 162 is connected to a gas supply port 160a at the buffer chamber 160.

The processing chamber 110 is enclosed by a dipole ring magnet 166. The dipole ring magnet 166 is constituted with a pair of annular or coaxial magnets disposed at an upper position and a lower position over a distance from each other in the embodiment. The magnets constituting the dipole ring magnet 166 are each achieved by housing a plurality of anisotropic segment pole magnets in a ring-shaped casing formed of a magnetic material so that they form uniform horizontal magnetic fields that are oriented in a single direction as a whole inside the processing chamber 110. As the processing gas is supplied into the processing chamber 110, a magnetron discharge is caused by an RF electric field along the vertical direction attributable to the high-frequency source 132 and the horizontal magnetic field attributable to the dipole ring magnet 166 in the space between the upper electrode 138 and the lower electrode 112 in the processing chamber 110 and, as a result, high-density plasma is generated near the surface of the lower electrode 112.

The plasma processing apparatus includes a control unit 168 that controls the individual units in the apparatus. The control unit 168 controls the operations of, for instance, the evacuation device 128, the high-frequency source 132, the switch 143 for the electrostatic chuck, the chiller unit 146, the heat transfer gas supply unit 152 and the processing gas supply unit 162. The control unit 168 may be connected to a host computer within the factory (not shown) to enable control from the host computer.

When executing, for instance, an etching process with the plasma processing apparatus 100 structured as described above, the gate valve 130 is first set in an open state to allow the wafer W, i.e., the workpiece, to be carried into the processing chamber 110 and placed on the lower electrode 112. At this time, a DC voltage from the DC source 142 is applied to the electrode 140a of the electrostatic chuck 140 to electrostatically attract the wafer W onto the lower electrode 112. Then, a specific type of processing gas such as NH3 is supplied from the processing gas supply unit 162 into the processing chamber 110 at a predetermined flow rate and a predetermined flow rate ratio, and the pressure inside the processing chamber 110 is set to a predetermined value via the evacuation device 128. In addition, high-frequency power at a specific frequency is applied from the high-frequency source 132 to the lower electrode 112 at a predetermined power level. The processing gas supplied into the processing chamber 110 via the upper electrode 138 as described above is raised to plasma between the two electrodes 112 and 138 through a high-frequency discharge and the work surface of the wafer W is etched with radicals and ions occurring in the plasma.

By applying high-frequency power at a frequency higher than that in the related art, e.g., 50 MHz or higher, to the lower electrode 112, a higher density can be achieved for the plasma in a more desirable state of dissociation and high density plasma can be formed at a lower pressure.

Next, the upper electrode (shower head) 138 representing an example that may be adopted in the gas supply unit in the embodiment is explained in further detail in reference to drawings. FIG. 2 is a sectional view of the structure adopted in the upper electrode in the embodiment, whereas FIG. 3 presents another example of an upper electrode provided for comparison with the upper electrode in the embodiment.

As shown in FIG. 2, insert members 200 are inserted at gas passing holes 156a constituting part of the gas supply holes, which are located at the electrode plate 156 in the upper electrode 138 in the embodiment. The insert members 200, which can be attached to and detached from the electrode plate 156 freely, can be replaced by insert members 200 with any of various structures featuring gas passages formed in different shapes and constituted of different materials, in correspondence to various conditions such as the gas type and the plasma density level. The insert members 200 are used to prevent charged particles such as electrons and ions in the plasma generated within the processing chamber 110 from entering the upper electrode through the gas passing holes 156*a*. The insert members 200 each include a gas passage 212 through which the processing gas flows. The gas passage 212 is formed so that entry of charged particles in the plasma is disallowed while the processing gas is allowed to flow through it. It is to be noted that the structure of the insert members 200 is to be described in detail later.

Figure 3:
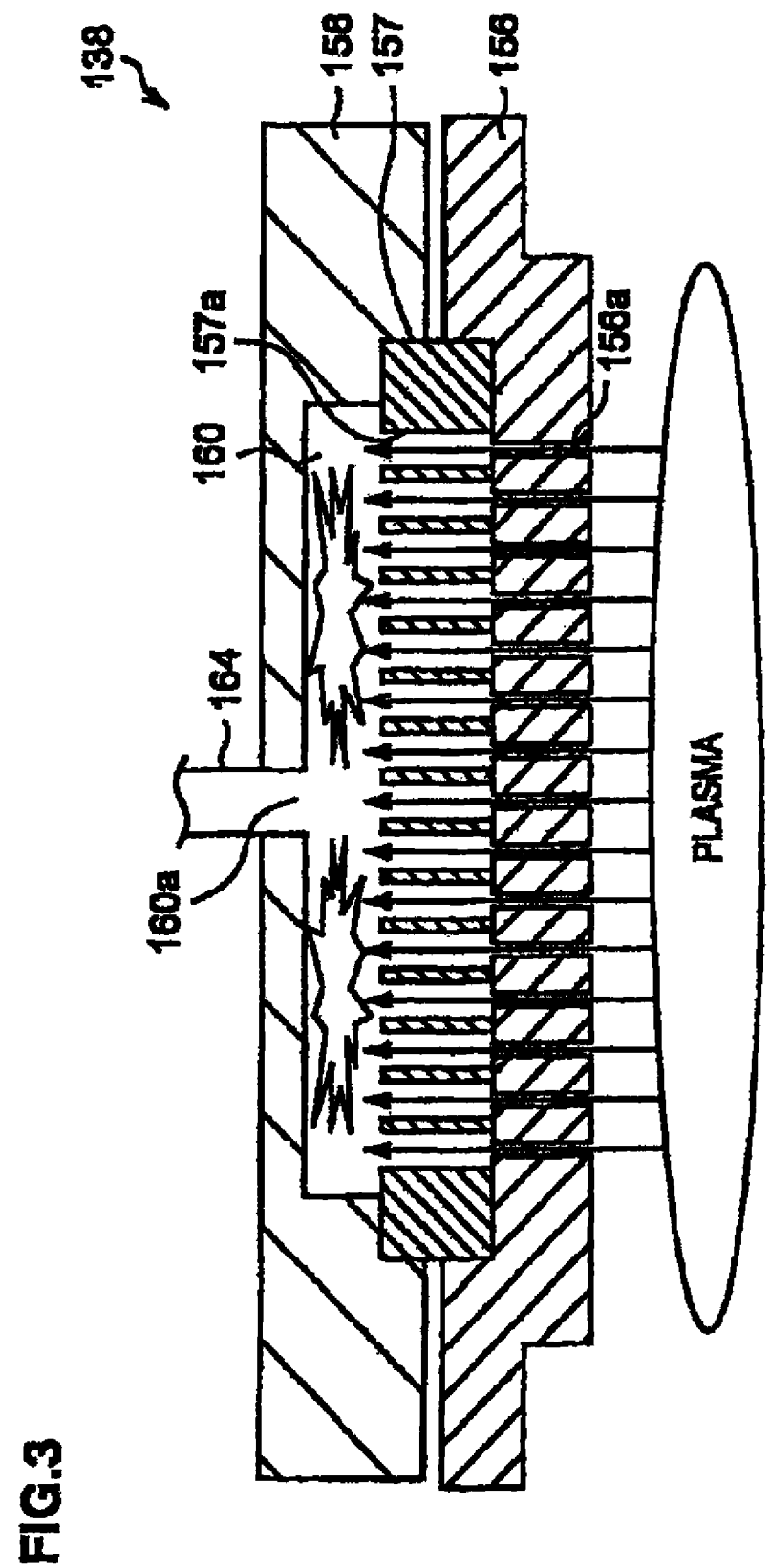
FIG. 3 is a schematic a sectional view of the upper electrode which does not include the insert members achieved in the embodiment.

If the insert members 200 are not inserted at the gas passing holes 156*a* of the upper electrode 138 as shown in FIG. 3, charged particles in the plasma may enter the upper electrode 138 through the gas passing holes 156*a* at the electrode plate 156. Electrons, which move particularly fast among charged particles, can enter the gas supply unit with ease. If charged particles in the plasma enter the upper electrode 138, a glow discharge occurs in the buffer chamber 160 inside the upper electrode 138, which results in reaction products becoming adhered to the inner surfaces at the upper electrode 138 and corrosion inside the upper electrode.

In addition, while the charged particles in the plasma are allowed to enter the upper electrode 138 when the length of the mean free path of the charged particles in the plasma is substantially equal to or greater than the thickness of the electrode plate 156 (the height of the gas supply holes), entry of charged particles may be attributed to the following causes as well. For instance, the potential (the ground potential) at the electrode support body 158 constituting the upper wall of the buffer chamber 160 in the upper electrode 138 may become lower than the potential (the ground potential) at the electrode plate 156, which is in electrical contact with the intermediate member 157 constituting a lower wall of the buffer chamber 160. In such an event, charged particles in the plasma are allowed to enter the buffer chamber 160 with greater ease from the gas passing holes 156*a* at the electrode plate 156 and flow toward the electrode support body 158.

In addition, while the upper electrode 138 normally maintains a field free state inside, the equipotential line will become skewed at the ends of the gas supply holes (each constituted with a gas passing hole 156*a* and the corresponding gas communicating hole 157*a*) and shifts into any clear gas supply hole, thereby allowing a concentration of the energy of the electrons and the like in the gas supply hole. Namely, when charged particles such as electrons are caused to oscillate by high-frequency power, they oscillate along a direction perpendicular to the equipotential line and thus, if the equipotential line becomes skewed and shifts into the end of a gas supply hole, the oscillating direction of the charged particles, too, becomes tilted, which causes the energy of the charged particles such as electrons to readily concentrate at the end portion of the gas supply hole. As a result, the charged particles such as electrons are allowed to enter the gas supply holes with ease. Under these circumstances, the charged particles are more likely to enter the buffer chamber 160 while holding a high level of energy.

Such entry of charged particles from the plasma can be prevented by forming a passage extending along a direction perpendicular to or at an angle to the central axis of each gas supply hole so as to regulate the flow along the central axis. The entry of the charged particles in the plasma can be prevented more effectively as the length of the passage extending along the direction perpendicular to or at an angle to the central axis increases, since the charged particles in the plasma along the vertical direction will more readily collide with the wall or the like defining the gas passage as the length of the passage extending along the direction perpendicular to or at an angle to the central axis increases and thus, the energy level of the charged particles in the plasma can be kept low. The presence of such a passage at each gas supply hole prevents the charged particles in the plasma from advancing to the buffer chamber 160 at the upper electrode 138.

Furthermore, the charged particles in the plasma are likely to enter the upper electrode 138 most readily when various conditions such as a specific gas supply hole diameter, a specific gas type and a specifics plasma density level coincide. This leads to a concept that if the gas passage at the gas supply hole can be altered in correspondence to predetermined conditions, the entry of the charged particles from the plasma into the upper electrode 138 can be prevented more effectively.

Based upon this concept, an insert member 200 is inserted at each of the gas supply holes at the upper electrode 138 and the part of the gas passage formed at the insert member, which extends vertically or at an angle is made to range over a sufficient length, according to the present invention. In addition, insert members 200 can be replaced with a different type of insert members in conformance to various conditions such as the gas type and the plasma density so as to alter the passage through the gas supply hole to adjust to specific conditions.

Figure 4A:
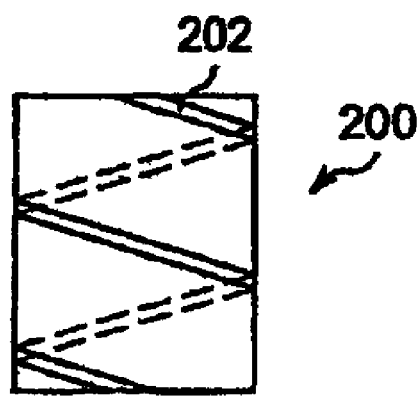
FIG. 4 presents a structural example that may be adopted in the insert members in the embodiment, with FIG. 4A showing an external view of an insert member and FIG. 4B showing a sectional view of an insert member.

Next, structural examples that may be adopted in the insert members 200 inserted at the gas passing holes 156*a* constituting part of the gas supply holes at the upper electrode 138 as described above are explained in reference to drawings. FIG. 4 presents a structural example that may be adopted in the insert members mounted at the gas supply holes of the upper electrode. FIG. 4A presents an external view of an insert member, whereas FIG. 4B presents a sectional view of the insert member mounted at a gas passing hole 156*a*.

Figure 4B:
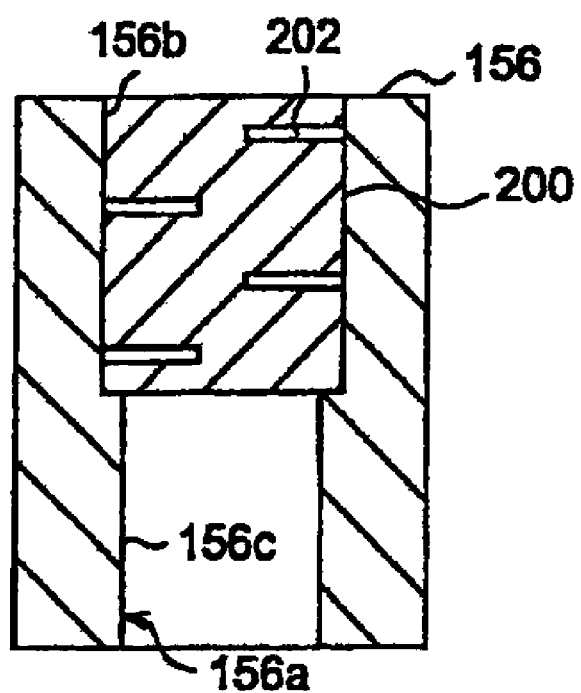

As shown in FIGS. 2 and 4B, the gas passing holes 156*a* formed at the electrode plate 156 of the upper electrode 138 are each constituted with a hole 156*b* formed on the side toward the intermediate member 157 and a hole 156*c* which communicates with the hole 156*b* and has a diameter smaller than that of the hole 156*b*. The insert members 200 are inserted at the hole 156*b* which constitute part of the gas passing holes 156*a* and are formed on the side toward the intermediate member 157.

The insert members according to the present invention each include a gas passage formed to extend along a direction perpendicular to or at an angle to the central axis of the gas supply hole so as to regulate the flow along the central axis. For instance, a gas passage 202 at the insert member 200 in FIG. 4 is formed in a spiral shape so as to communicate between the upper end and the lower end of the insert member 200 while constantly regulating the flow along the central axis at the gas passing hole 156*a*. In more specific terms, such a gas passage may be achieved by forming a spiral groove at the external circumferential surface of the insert member 200, as shown in FIG. 4A, for instance. The gas passage 202 is formed by this spiral groove and the inner wall of the gas passing hole 156*a* as the insert member 200 is inserted at the gas passing hole 156*a*. It is to be noted that although not shown, the gas passage may instead be formed in a zigzag pattern at the insert member.

In addition, as shown in FIG. 4B, the gas passage 202 may be formed so that its section has a width (groove depth) along a direction extending perpendicular to the central axis of the gas passing hole, which is larger than the thickness of the gas passing hole 156a along the central axis. As the number of turns of the spiral gas passage 202 increases, the entry of charged particles can be prevented with greater effectiveness. However, as the number of turns of the spiral gas passage 202 increases, the gas passage becomes narrower, resulting in a lowered flow rate of the processing gas. Accordingly, the number of turns that the spiral gas passage 202 makes should be determined so as to strike an optimal balance between the desired level of charged particle entry prevention and the desired processing gas flow rate. For instance, it is desirable to form the spiral gas passage so that it makes 1.5 turns or more at the external side surface of the insert member 200.

When such insert members 200 are inserted at the individual gas passing holes 156a, the gas passages 202 of the insert members 200 regulate the flow along the central axes of the individual gas passing holes 156a at all times and thus, any charged particles in the plasma that may enter through the gas passing holes 156a are bound to collide into the inner walls or the like of the insert members 200 and lose their energy before they reach the upper ends of the insert members 200.

Furthermore, even if the equipotential line becomes skewed at the end of a gas passing hole 156a and the direction along which charged particles such as electrons oscillate becomes tilted as a result to allow the charged particles to enter through the gas passing hole 156a, the flow along the central axis of the gas passing hole 156a is regulated by the gas passage 202 at all times. Thus, the charged particles collide into the inner wall or the like of the insert member 200 and their energy becomes dissipated before they reach the upper end of the insert member 200.

Consequently, the charged particles in the plasma are prevented from entering the buffer chamber 160 inside the upper electrode 138 with a high degree of effectiveness. With no energy transferred into the buffer chamber 160, it is ensured that a glow discharge does not occur within the buffer chamber 160.

In addition, since the gas passage 202 of the insert member 200 is formed so that its thickness along the central axis of the gas passing hole 156a is smaller than its width (groove depth) along the direction perpendicular to the central axis, as shown in FIG. 4B. The space inside the gas passing hole 156a along the axial direction can be narrowed to cause charged particles such as electrons to readily collide into the wall and the like of the insert member 200 and to lose energy quickly. Furthermore, as the flow rate of the processing gas can be increased, the occurrence of a glow discharge inside the upper electrode 138 can be prevented without having to greatly alter the gas outlet characteristics of the upper electrode (shower head) 138.

Figure 5A:
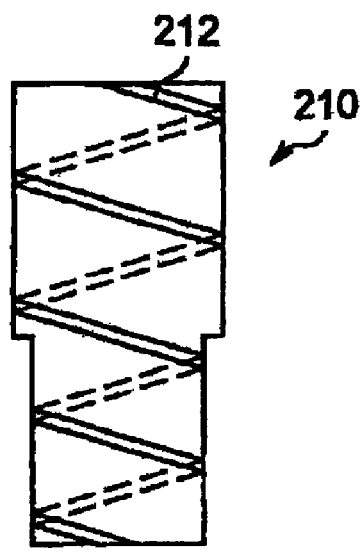
FIG. 5 presents another structural example that may be adopted in the insert members in the embodiment, with FIG. 5A showing an external view of an insert member and FIG. 5B showing a sectional view of an insert member.
Figure 5B:
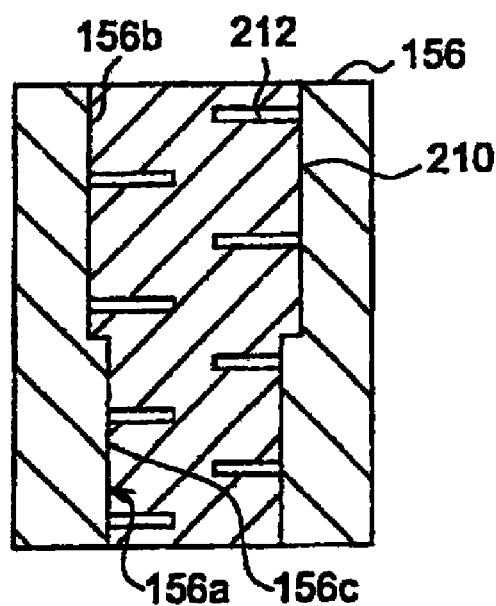

It is to be noted that the insert members according to the present invention may each be detachably mounted through the entire length of the gas passing hole 156a at the electrode plate 156, as in the case of an insert member 210 shown in FIG. 5. FIG. 5A presents an external view of the insert member 210, whereas FIG. 5B is a sectional view of the insert member 210 mounted at the gas passing hole 156a. A gas passage 212 of this insert member 210 may be formed over the entire insert member 210, as shown in FIG. 5A, for instance.

Figure 6:
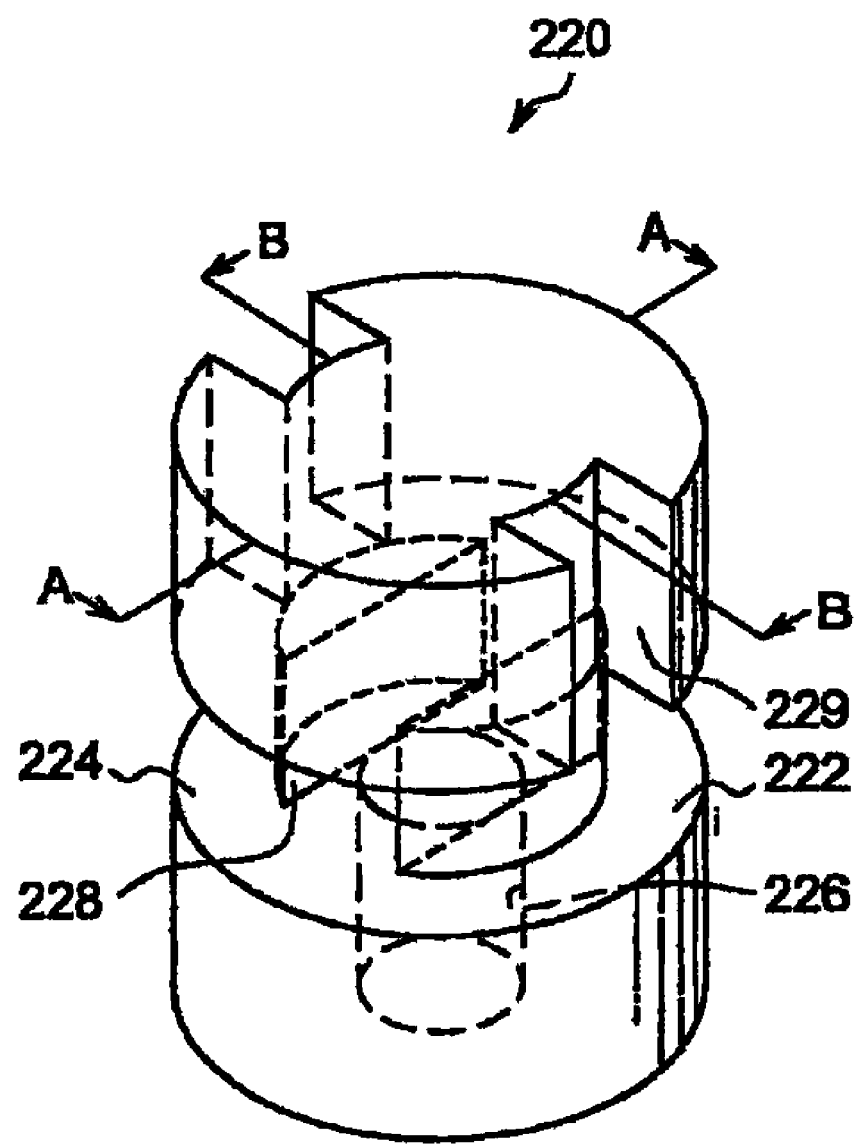
FIG. 6 is a perspective of another structural example that may be adopted in the insert members in the embodiment.

In another specific example of the insert members according to the present invention, the gas passage formed to regulate the flow along the central axis of the gas supply hole and extends along the direction perpendicular to or at an angle to the central axis may be present along both the diameter and the circumference of the insert member. More specifically, it may be provided as an insert member 230 shown in FIGS. 6 and 7. FIG. 6 is a perspective showing the structure adopted in the insert member 220, whereas FIG. 7A and FIG. 7B are both sectional views taken along A-A and B-B in FIG. 6 respectively.

The insert member 220 is detachably inserted at the hole 156b in the gas passing hole 156a at the electrode plate 156, as is the insert member 200 shown in FIG. 4. As shown in FIGS. 6 and 7, the insert member 220 has an overall shape of a substantially circular column with a circumferential groove 224 formed at a substantially middle portion of the outer side surface.

Figure 7A:
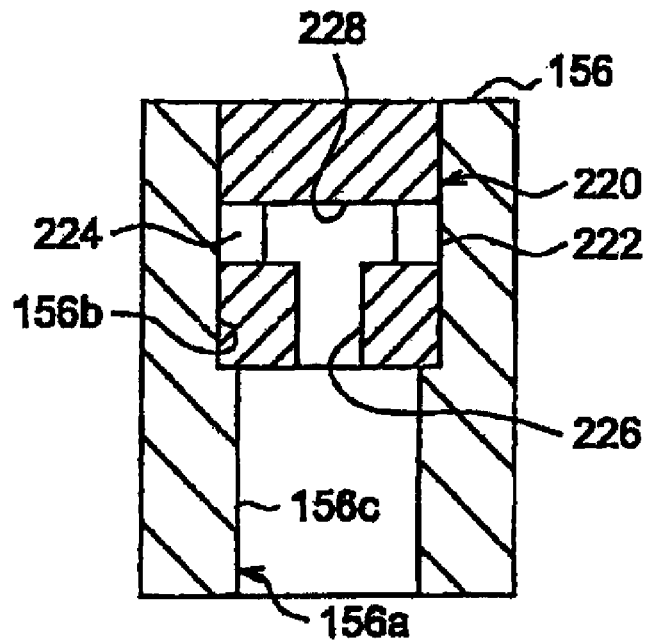
FIG. 7 presents sectional views of the insert member in FIG. 6, with FIG. 7A showing a sectional view of the insert member in FIG. 6 taken along A-A and FIG. 7B showing a sectional view of the insert member in FIG. 6 taken along B-B.

At a lower position relative to the circumferential groove 224 of the insert member 220, an axial hole 226 is formed along the axis of the gas passing hole 156a and a diameter-direction hole 228 is formed along the diameter of the gas passing hole 156a to communicate with the upper end of the axial hole 226, as shown in FIG. 7A. The diameter-direction hole 228 is in communication with the circumferential groove 224. The diameter-direction hole 228 and the circumferential groove 224 together form a passage extending perpendicular to or at an angle to the central axis of the gas supply hole.

Figure 7B:
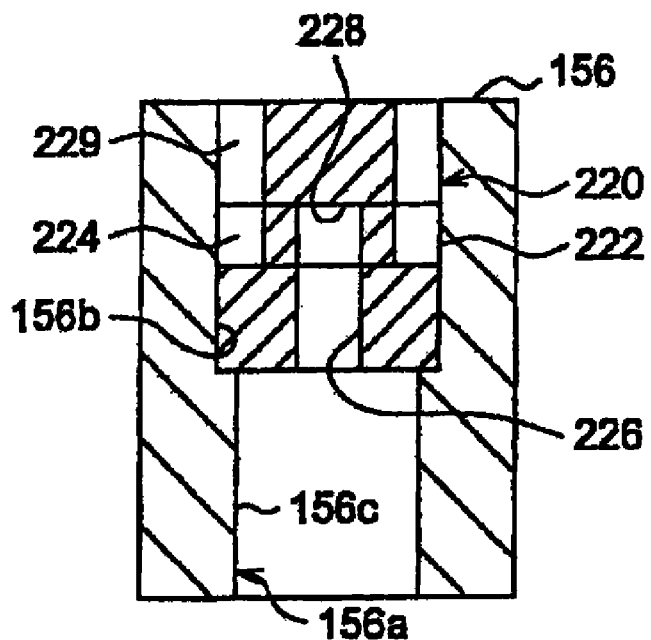

As shown in FIG. 7B, at a position upward relative to the circumferential groove 224 of the insert member 220, axial grooves 229 are formed perpendicular to the direction along which the diameter-direction hole 228 is formed so as to cut through to the upper end of the insert member 220. The lower ends of the axial grooves 229 are in communication with the circumferential groove 224.

As the insert member 220 is inserted at the gas passing hole 156a, a passage is formed by the individual grooves and the inner wall of the gas passing hole 156a. A gas passage 222 of the insert member 220 adopting the structure described above extends upward from its lower end along the axial direction through the axial hole 226, passes along the diameter through the diameter-direction hole 228 from the upper end of the axial hole 226, makes a 90° turn along the circumferential groove 224 and then extends upward through the axial grooves 229 to the upper end of the gas passage 222.

By inserting this insert member 220 at each gas passing hole 156a, it can be ensured that even if charged particles in the plasma enter the gas passing hole 156a, they cannot reach the axial grooves 229 without first advancing along the diameter through the diameter-direction hole 228 and then making a 90° turn at the circumferential groove 224. Since the flow in the gas passing hole 156a along its central axis is regulated with the passage extending both along the diameter and along the circumference in this manner, the charged particles are bound to collide into the inner wall or the like of the insert member 220 and lose energy before they reach the upper end of the insert member 220.

In addition, even if the equipotential line becomes skewed at the end of a gas passing hole 156a causing a tilt in the direction along which charged particles such as electrons oscillate and the charged particles are allowed to enter the gas passing hole 156a, the flow in the gas passing hole 156a along the central axis is regulated by the gas passage 222 at all times and thus, charged particles are bound to collide into the inner wall or the like of the insert member 220 to lose energy before they reach the upper end of the insert member 220.

Such insert members 220, too, make it possible to effectively prevent entry of charged particles in the plasma into the buffer chamber 160 at the upper electrode 138. As a result, no energy is transferred into the buffer chamber 160 and the occurrence of a glow discharge inside the buffer chamber 160 can be prevented with a high degree of reliability.

It is to be noted that the dimensions of the section of the gas passage 222 at the insert member 220, too, should be determined so as to strike an optimal balance between the desired level of charged particle entry prevention and the desired processing gas flow rate. More specifically, if the diameter of the gas passing hole 156a is approximately 4 mm to 5 mm, it is desirable to set the height of the gas passing hole 156a along the axial direction over the diameter-direction hole 228 and the circumferential groove 224 in the gas passage 222 to 0.5 mm to 1.5 mm.

Next, materials that may be used to constitute the insert members according to the present invention, are explained. The insert members 200, 210 and 220 described above may be constituted of a fluororesin such as Teflon (registered trademark), a tetrafluoroethylene resin (PTFE), a chlorine trifluoroethylene resin (PCTFE), a tetrafluoroethylene parfluoroalkylvynylether copolymer resin (PFA), a tetrafluoroethylene-hexafluoride propylene copolymer resin (PFE) or a fluorovinyllidene resin (PVDF) instead of quartz. These materials are desirable since they have low dielectric constants, achieve a high level of voltage withstanding performance against AC voltages and can be processed with ease, which makes it possible to minimize production costs. Alternatively, the insert members may be constituted of a porous ceramic instead of a resin. Furthermore, the insert members 200 achieved in the embodiment, which are used in the field free upper electrode 138, may instead be constituted of metal, e.g., aluminum, instead of resin.

The insert members mounted at the gas supply holes in the upper electrode 138 in the embodiment are interchangeable. Accordingly, the optimal type of insert members should be selected in correspondence to various conditions including the gas type and the plasma density to be inserted at the gas supply holes in the upper electrode 138. By using the optimal insert members, it is possible to fully prevent charged particles in the plasma generated in the processing chamber 110 from entering the upper electrode 138, which constitutes the gas supply unit.

More specifically, insert members constituted of different materials may be mounted in correspondence to different types of processing gases. For instance, insert members constituted of polyimide may be used in conjunction with a CF gas, and insert members constituted of PTFE with a high level of corruption resistance may be used in conjunction with a corrosive gas such as a NH3 gas, a HBR gas or a Cl2 gas.

In addition, insert members formed in different shapes may be mounted in correspondence to different density levels of the plasma generated inside the processing chamber 110. For instance, as the plasma density rises, it becomes necessary to more rigorously ensure that charged particles in the plasma cannot enter the upper electrode readily and, accordingly, the insert members 200 or 210 having the spiral gas passages 202 or 212 as shown in FIG. 4 or FIG. 5 should be used, whereas if the plasma density is low, the insert members 220 having the gas passages 222 structured as shown in FIGS. 6 and 7 formed therein are good enough.

As explained in detail above, the present invention provides a plasma processing apparatus with which it is impossible to fully prevent charged particles in plasma generated inside the processing chamber from entering the gas supply unit.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while high-frequency power is applied to the lower electrode 112 alone and the upper electrode 138 is grounded in the explanation given above on the plasma processing apparatus 100 achieved in the embodiment, the present invention may also be adopted in a plasma processing apparatus in which high-frequency power is also applied to the upper electrode 138 as well as to the lower electrode 112. In such a case, too, a glow discharge inside the upper electrode 138 can be prevented as effectively as in the embodiment.

In addition, the present invention may be adopted in a plasma processing apparatus other than a plane parallel plasma etching apparatus, such as a helicon wave plasma etching apparatus or an inductively coupled plasma etching apparatus. In more specific terms, the present invention may be adopted in plasma processing apparatuses such as those explained in reference to FIGS. 8 to 11 and FIGS. 12 through 21.

(Another Example of Plasma Processing Apparatus in Which the Present Invention May Be Adopted)

Next, another example of a plasma processing apparatus in which the present invention may be adopted is explained in reference to drawings. The plasma processing apparatus in this example is employed to execute specific types of plasma processing such as etching and film formation processing on work substrates, e.g., semiconductor wafers or glass substrates for liquid crystal display devices, by using plasma.

It is an established practice in the area of semiconductor device production to process a work substrate such as a semiconductor wafer or a glass substrate for a liquid crystal display device in a desired manner by employing a plasma processing apparatus that executes, for instance, etching processing or film formation processing on the work substrate with plasma generated inside a vacuum chamber and applied onto the work substrate.

In the plasma processing apparatus which may be a so-called plane parallel plasma processing apparatus, a stage on which the semiconductor wafer or the like is placed is provided inside the vacuum chamber, a shower head is provided at the ceiling of the vacuum chamber so as to face opposite the stage and a pair of plain parallel electrodes are constituted with the stage and the shower head.

A specific type of processing gas is supplied from the shower head into the vacuum chamber and at the same time, the vacuum chamber is evacuated through its bottom so as to fill the vacuum chamber with a processing gas atmosphere achieving a predetermined degree of vacuum. In this state, high-frequency power with a predetermined frequency is supplied between the stage and the shower head, thereby generating plasma with the processing gas, and as the plasma is applied to the semiconductor wafer, the semiconductor wafer is processed, e.g., etched.

The plasma processing apparatus in the related art as described above include those having an evacuation ring formed as an annular plate surrounding the stage with numerous permeating hole or slit-shaped evacuating passages formed therein to achieve an even flow of the processing gas around the semiconductor wafer by uniformly evacuating the atmosphere around the stage and to prevent a plasma leak from the processing space (see, for instance, Japanese Utility Model Publication No. 5-8937 (FIGS. 1 through 3)).

While the evacuation ring has a function of preventing a plasma leak from the processing space within the vacuum chamber, as described above, it is necessary to ensure that electrons are not allowed to pass through the evacuating passages readily by reducing the opening area of the evacuating passages or increasing the length of the evacuating passages in the evacuation ring in order to further improve the plasma leak preventing effect. It is to be noted that if a plasma leak occurs, the plasma becomes unstable and it becomes difficult to execute a specific type of plasma processing on the semiconductor wafer or the like. For this reason, the likelihood of a plasma leak needs to be minimized.

However, if the function of the evacuation ring for preventing plasma leak is improved as described above, it becomes more difficult to achieve a sufficient level of conductance of the gas. This gives rise to a problem in that with the evacuation performance becoming poor, the processes that can be executed become limited. If, on the other hand, priority is given to high evacuation performance in order to avoid the problem discussed above, it becomes necessary to use a large high-performance vacuum pump to result in an increase in the apparatus production costs.

As described above, if the function of the evaluation ring for preventing a plasma leak is improved, the conductance of the gas becomes poor, and it is difficult to satisfy both the requirements for the plasma leak preventing function and the sufficient level of conductance of the gas in the plasma processing apparatus in the related art. This leads to problems in that a desired type of plasma processing cannot be executed due to the occurrence of a plasma leak and in that the processes which can be executed become limited due to poor conductance of the gas and the like.

Accordingly, an object of the present invention, which has been completed by addressing the problems discussed above, is to provide a plasma processing apparatus having a high level of gas conductance capacity to enable a wide range of processes without increasing the production costs and also having an effective plasma leak preventing function to allow plasma processing to be executed in a desirable manner with stable plasma.

In order to achieve the object described above, in, an aspect of the present invention, a plasma processing apparatus comprising a vacuum chamber in which a work substrate is placed, a stage disposed within the vacuum chamber on which the work substrate is placed, a plasma generating mechanism that generates plasma within the vacuum chamber to be used to execute a specific type of processing on the work substrate, an evacuation ring disposed so as to surround the stage and having an evacuating passage formed therein and an evacuation mechanism that evacuates the vacuum chamber via the evacuating passage, characterized in that the evacuation ring includes a side wall portion formed substantially perpendicular to the surface of the stage on which the work substrate is placed and a bottom portion ranging inward from the lower end of the side wall portion and in that the evacuating passage is formed at least at the side wall portion, is provided.

The side wall portion of the evacuation ring is constituted with an inner cylindrical member and an outer cylindrical member disposed coaxially to each other over a predetermined distance from each other, which should be positioned so as to offset an opening at the inner cylindrical member and an opening at the outer cylindrical member from each other.

In this structure, the opening at the inner cylindrical member and the opening at the outer cylindrical member may be formed in a longitudinally elongated rectangular shape, and the inner cylindrical member and the outer cylindrical member may each have a plurality of such openings set along the circumferential direction over predetermined intervals.

In addition, the evacuating passage may be formed with the opening formed at the inner cylindrical member, a clearance formed between the inner cylindrical member and the outer cylindrical member and the opening formed at the outer cylindrical member.

Also, the evacuating passage may be formed at the bottom portion of the evacuation ring in the plasma processing apparatus.

In another aspect of the present invention, the object described above is achieved by providing a plasma processing apparatus comprising a vacuum chamber in which a work substrate is placed, a stage disposed within the vacuum chamber on which the work substrate is placed, a plasma generating mechanism that generates plasma inside the vacuum chamber to be used to execute a specific type of processing on the work substrate, an evacuation ring disposed so as to surround the stage and having an evacuating passage formed therein and an evacuation mechanism that evacuates the vacuum chamber from the bottom of the evacuation ring via the evacuating passage, characterized in that the evacuation ring includes a first member having a first opening and a second member disposed over a distance with a clearance formed between the first member and the second member and having a second opening formed at a position offset from the first opening, in that the evacuating passage is formed to extend from the first opening into the clearance and pass through the clearance to be led out from the second opening and in that the plasma is trapped inside the clearance.

Figure 8:
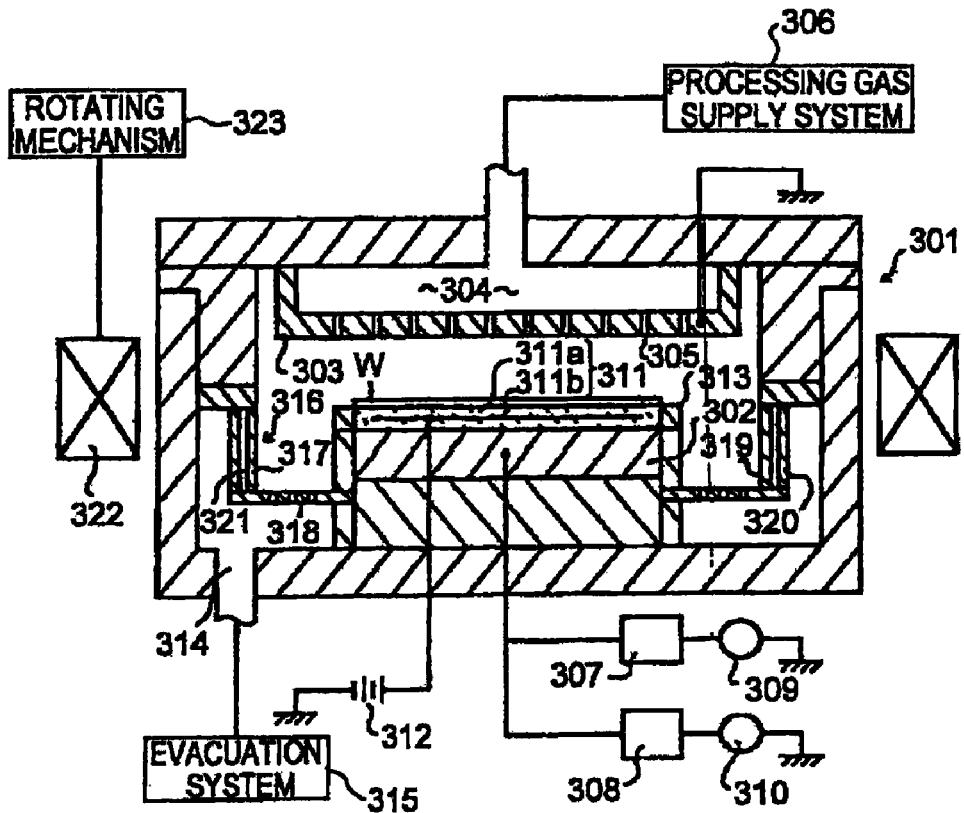
FIG. 8 schematically illustrates the overall structure of another plasma processing apparatus in which the present invention may be adopted.

The present invention achieved in an embodiment is now explained in detail in reference to drawings. FIG. 8 is a schematic illustration of the structure adopted in the embodiment achieved by adopting the present invention in a plane parallel plasma etching apparatus used to etch semiconductor wafers. In FIG. 8, reference numeral 301 indicates a cylindrical vacuum chamber constituted of, for instance, aluminum and having an internal space that can be closed off in an airtight state.

A stage 302 on which a semiconductor wafer W is placed is provided inside the vacuum chamber 301, and the stage 302 also functions as a lower electrode. At the ceiling inside the vacuum chamber 301, a shower head 303 constituting an upper electrode is disposed and a pair of plain parallel electrodes are constituted by the stage 302 and the shower head 303.

A free space 304 in which the gas is diffused is formed at the shower head 303 and numerous narrow holes 305 are formed on the lower side relative to the free space 304 for gas diffusion. A specific type of processing gas supplied from a processing gas supply system 306 is diffused inside the free space 304 for gas diffusion, and the diffused processing gas is then supplied in a shower directed toward the semiconductor wafer W through the narrow holes 305. While the potential at the shower head 303 is set to the ground level in the embodiment, a high-frequency source may be connected to the shower head 303 to apply high-frequency power both to the stage 302 and to the shower head 303, instead.

Two high-frequency sources 309 and 310 are connected to the stage 302 via two matchers 307 and 308 respectively and, as a result, high-frequency power can be supplied to the stage 302 by superimposing the high frequency power with one of the two different specific frequencies (e.g., 100 MHz and 3.2 MHz) on the high frequency power with the other frequency. It is to be noted that a single high-frequency source may be used to supply high-frequency power to the stage 302 so that high-frequency power with a single frequency is supplied to the stage 302, instead.

In addition, an electrostatic chuck 311 which electrostatically holds the semiconductor wafer W is provided at the surface of the stage 302 on which the semiconductor wafer W is placed. The electrostatic chuck 311 adopts a structure achieved by disposing an electrostatic chuck electrode 311b inside an insulating layer 311a, with a DC source 312 connected to the electrostatic chuck electrode 311b. A focus ring 313 is provided at the upper surface of the stage 302 so as to surround the semiconductor wafer W.

An evacuation port 314 is provided at the bottom of the vacuum chamber 301, and an evacuation system 315 constituted of a vacuum pump and the like is connected to the evacuation port 314.

Figure 9:
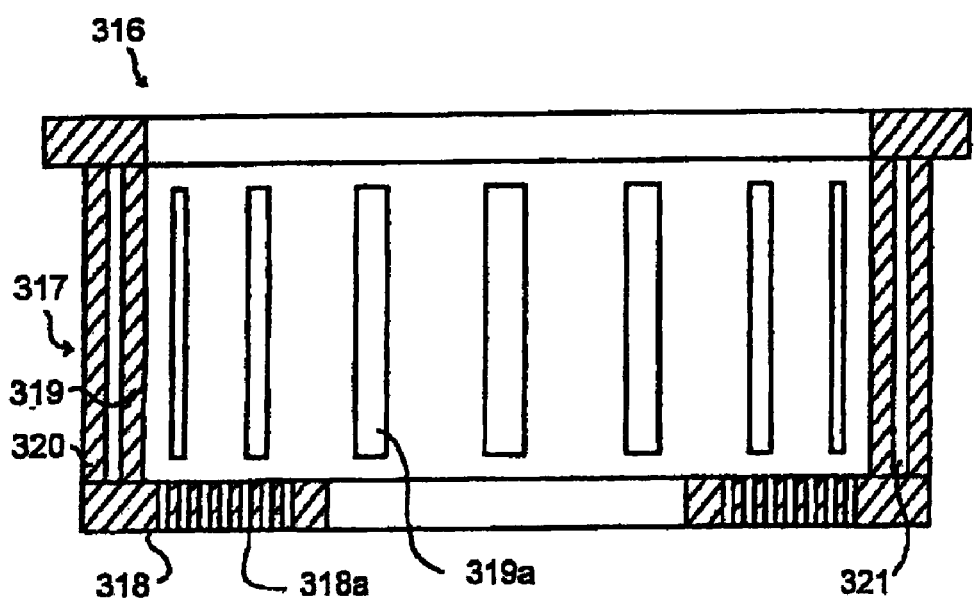
FIG. 9 schematically illustrates the structure of an essential portion of the plasma processing apparatus in FIG. 8.

An evacuation ring 316 formed in an annular shape is provided around the stage 302. As shown in FIG. 9, the evacuation ring 316 includes a side wall portion 317 formed to range downward almost perpendicularly and a bottom portion 318 ranging inward perpendicular to the bottom end of the side wall portion 317.

Figure 10:
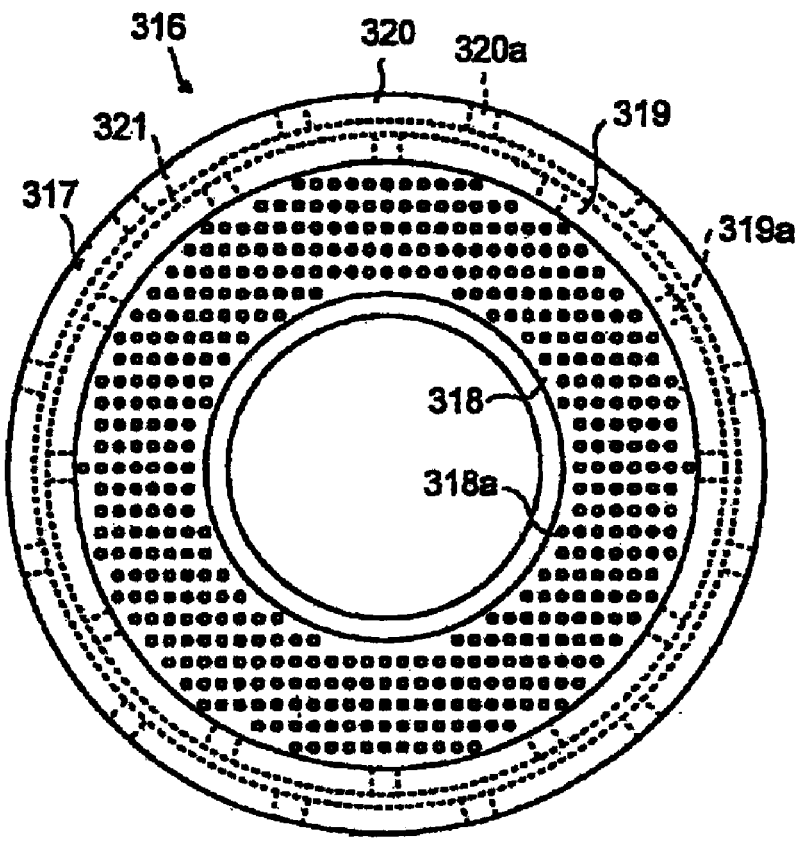
FIG. 10 schematically illustrates the structure of an essential portion of the plasma processing apparatus in FIG. 8.

As shown in FIG. 10, the side wall portion 317 is constituted with an inner cylindrical member 319 and an outer cylindrical member 320 disposed, coaxially to each other over a predetermined distance from each other. The inner cylindrical member 319 includes a plurality of openings 319a formed in a vertically elongated rectangular shape and set over specific intervals along the circumferential direction to constitute evacuating passages. In addition, as shown in FIGS. 10 and 14, the outer cylindrical member 320, too, includes a plurality of openings 320a formed in a vertically elongated rectangular shape to constitute the evacuating passages. The openings 319a and the openings 320a are disposed so that they are offset from each other by a predetermined extent (by the distance C in FIG. 11) along the circumferential direction.

The evacuating passages are thus each formed so that the gas passes through the openings 319a at the inner cylindrical member 319, then passes through a clearance 321 formed between the inner cylindrical member 319 and the outer cylindrical member 320 and subsequently is discharged through the openings 320a at the outer cylindrical member 320, as the arrows in FIG. 11 indicate.

Figure 11:
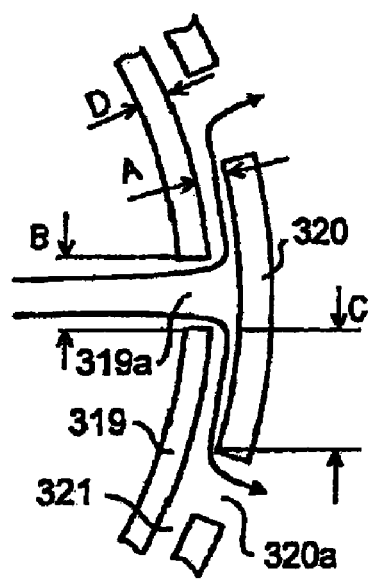
FIG. 11 schematically illustrates the structure of an essential portion of the plasma processing apparatus in FIG. 8.

The dimensions A to D in FIG. 11, i.e., the width A of the clearance 321, the width B of the openings 319a, the width C over which the openings 319a are offset relative to the corresponding openings 320a and the thickness D of the inner cylindrical member 319 satisfy the following conditions:

$C/A > 1$ $B > 2A$ $B/D > 1$

Namely, the evacuation ring 316 achieves a structure that traps plasma in the clearance 321, and in order to assure this, the width A of the clearance 321 is set relatively small, whereas the offset width C of the openings 319a and the openings 320a is set large enough to trap the plasma.

In addition, the width B of the openings 319a, which are not used to trap the plasma, is set to a large value to ensure a high enough conductance level with a large opening area, and for the same reason, the thickness D of the inner cylindrical member 319 is set to a small value. The thickness of the outer cylindrical member 320 and the width of the openings 320a, too, are set to similar values based upon the same principle.

It is to be noted that FIG. 11 schematically illustrates the structure of the evacuation ring 316 and it does not indicate the actual dimensions accurately. In the actual application, the width B of the openings 319a is set greater than 2 mm, e.g., approximately several millimeters if, for instance, the width A of the clearance 321 is set to 1 mm. The offset width C of the openings 319a and the openings 320a and the thickness D of the inner cylindrical member 319 are also set to values conforming to the conditions presented earlier and taking machinability into consideration.

The length of the side wall portion 317 along the vertical direction, too, is set to a value that will allow the openings 319a and the openings 320a to range over large enough areas and assures a satisfactory level of conductance.

By forming evacuating passages at the side wall portion 317 of the evacuation ring 316 and setting the length of the side wall portion 317 along the vertical direction to a relatively large value, as described above, the openings are allowed to range over large enough areas and thus a satisfactory level of conductance is assured. In addition, since the diameter of the evacuation ring 316 does not need to be increased even though the openings range over great areas, the diameter of the vacuum chamber 301 itself does not need to increase, and thus, the footprint of the apparatus remains unchanged.

Furthermore, by forming the evacuating passages at the side wall portion 317 with the openings 319a, the clearance 321 and the openings 320a as described above, the openings are allowed to range over large areas to assure a satisfactory level of conductance while assuring the required plasma leak preventing function, as well.

In other words, while electrons in the plasma are allowed to pass through the openings 319a ranging over large areas in the gas flow indicated by the arrows in FIG. 11, the outer cylindrical member 320 is present ahead as the electrons advance and thus, the likelihood of the electrons further passing through the clearance 321 and being led out to the outside through the openings 320a is greatly lowered. Namely, since the plasma is highly unlikely to leak to the outside of the openings 320a, a satisfactory level of plasma leak preventing function can be assured even when the openings range over large areas to achieve a high level of conductance.

Moreover, numerous openings 318a each constituted as a circular hole are formed at the bottom portion 318 of the evacuation ring 316 as well, and these openings 318a, too, form evacuating passages in the embodiment. By forming evacuating passages at the bottom portion 318 in this manner, the conductance can be further improved.

Instead of forming the evacuating passages at the bottom portion 318 of the evacuation ring 316 with openings such as circular holes as described above, the evacuating passage at the bottom portion 318, may adopt a structure identical to that of the evacuating passages at the side wall portion 317. However, since the bottom portion 318 is located at a considerable distance from the area in which plasma is formed, the evacuating passage at the bottom portion 318 can be formed with simple circular holes or the like without having to consider the plasma leak preventing function as a crucial factor. In addition, if a sufficiently high level of conductance can be assured with the evacuating passages formed at the side wall portion 317 alone, no evacuating passages need to be formed at the bottom portion 318.

The evacuation ring 316 described above may be formed by using any material as long as it is electrically conductive and may be constituted of, for instance, stainless steel or aluminum with an alumite film or a sprayed coating deposited on the surface thereof. The evacuation ring 316 constituted of a conductive material is electrically connected to the ground potential.

As the vacuum chamber 301 is evacuated through the evacuation port 314 via the evacuation ring 316 adopting the structure described above by utilizing the evacuation system 315, the atmosphere inside the vacuum chamber 301 achieves a predetermined degree of vacuum.

Furthermore, a magnetic field forming mechanism 322 is provided around the vacuum chamber 301 so as to form a desired magnetic field in the processing space inside the vacuum chamber 301. The magnetic field forming mechanism 322 includes a rotating mechanism 323, and as the magnetic field forming mechanism 322 is rotated around the vacuum chamber 301, the magnetic field inside the vacuum chamber 301, too, is allowed to rotate.

Next, an etching process executed in the plasma etching apparatus structured as described above is explained. First, a gate valve (not shown) at a transfer port (not shown) is opened, and a semiconductor wafer W carried into the vacuum chamber 301 with a transfer mechanism or the like is set on the stage 302. The semiconductor wafer W placed on the stage 302 is then electrostatically held onto the electrostatic chuck 311 by applying a predetermined level of a DC voltage to the electrostatic chuck electrode 311b of the electrostatic chuck 311 from the D.C. source 312.

Next, after moving the transfer mechanism out of the vacuum chamber 301, the gate valve is closed, the vacuum chamber 301 is evacuated with the vacuum pump or the like of the evacuation system 315, and then, after a specific degree of vacuum is achieved inside the vacuum chamber 301, the processing gas to be used to execute a specific type of etching process is supplied from the processing gas supply system 306 into the vacuum chamber 301 via the free space 304 for gas diffusion and the narrow holes 305 at a flow rate of, for instance, 100 to 1000 sccm. Thus, the pressure inside the vacuum chamber 301 is sustained at, for instance, approximately 1.33 to 133 Pa (10 to 100 mTorr).

In this state, high-frequency power with specific frequencies (e.g., 100 MHz and 3.2 MHz) is supplied to the stage 302 from the high-frequency sources 309 and 310.

As the high-frequency power is applied to the stage 302 as described above, a high-frequency electric field is formed in the processing space between the shower head 303 and the stage 302. In addition, a specific magnetic field is formed in the processing space by the magnetic field forming mechanism 322. Thus, a plasma with specific characteristics is generated from the processing gas supplied into the processing space, and a specific film on the semiconductor wafer W becomes etched with the plasma.

During this process, the high conductance at the evacuation ring 316 makes it possible to evacuate the vacuum chamber with a high degree of efficiency and, as a result, the atmosphere inside the vacuum chamber easily achieves a high degree of vacuum without having to employ a large, high performance vacuum pump or the like. In addition, since a plasma leak can be prevented with a high degree of reliability at the evacuation ring 316, the desired etching process can be executed with a high level of accuracy with stable plasma.

After the specific etching process is executed, the supply of the high-frequency power from the high-frequency sources 309 and 310 is stopped, thereby ending the etching process, and then, the semiconductor wafer W is carried out of the vacuum chamber 301 by reversing the procedure described earlier.

It is to be noted that while the present invention is adopted in a plasma etching apparatus that etches semiconductor wafers in the embodiment described above, the present invention is not limited to this example. For instance, it may be adopted in an apparatus that processes substrates other than semiconductor wafers, or in an apparatus that executes processing other than etching, e.g., a film formation processing apparatus that executes CVD or the like.

The plasma processing apparatus described above achieving a high level of gas conductance capability supports a wide range of processes without necessitating an increase in the production costs and enables the plasma processing to be executed in a desirable manner with stable plasma achieved through its high level of plasma leak preventing function.

(Another Example of a Plasma Processing Apparatus in Which the Present Invention May Be Adopted)

Next, yet another example of the plasma processing apparatus in which the present invention may be adopted is explained. The present invention is adopted in a plasma processing apparatus that executes plasma processing on workpieces that may be glass substrates for flat displays (FPD) such as liquid crystal displays (LCD), i.e., FPD substrates such as LCD substrates, as well as semiconductor wafers in this example. More specifically, an explanation is given in reference to the example on a plasma processing apparatus capable of implementing control so as to drive a member such as an electrode disposed within the plasma processing apparatus to a desired position and its upper electrode unit.

In a plasma processing apparatus that executes plasma processing on a workpiece such as a semiconductor wafer (hereafter simply referred to as a wafer) or an LCD substrate during various processes of semiconductor devices or LCD substrate production, follow-up control is normally implemented by utilizing a servomotor, a stepping motor or the like as an actuator to implement control so as to linearly drive a member such as an a electrode disposed within the processing apparatus to a desired position.

In such a structure having a motor utilized as an actuator, a sturdy structural body is required to form a motive force communicating mechanism constituted of a pulley, gears, a belt or a chain to be used to convert the motor rotation to a linear motion, and thus, the processing apparatus itself is bound to be large in size. In addition, there is also a problem in that vibration and noise caused by the rotational motion of the motor and the motive force communicating mechanism adversely affect the results of the wafer processing. Furthermore, it requires a regular maintenance since the gears and the chain constituting the motive force communicating mechanism are consumables.

While it is conceivable to utilize an actuator constituted of a pneumatic actuator instead of a motor, the piping connection for a pneumatic actuator is bound to be complex and there is also the concern that an oil leak may cause contamination in the clean room. For these reasons, a pneumatic actuator is not suitable for an application in a plasma processing apparatus.

As an alternative, a pneumatic actuator may be utilized as the actuator. A pneumatic actuator is advantageous in that there is no risk of an oil leak or contamination of the clean room. There is another advantage to the pneumatic actuator in that it can be provided as a light weight, compact unit capable of achieving a high output. For these reasons, pneumatic actuators are used in plasma processing apparatus applications, in a wafer cassette elevator mechanism (see, for instance, the Japanese Patent Laid-open Publication No. 2001-35897) and in a gate switching mechanism (see, for instance, Japanese Patent Laid-open Publication No. 10-209245 (U.S. Pat. No. 6,113,734)) provided at the wafer transfer port in the processing chamber.

However, when a pneumatic actuator is used as the actuator to implement control on the drive of a member disposed inside the plasma processing apparatus, the compressibility due to the material characteristics inherent to air such as the viscosity and density, and the nonlinearity attributable to the communication delay compromise the control performance. In addition, the control performance is also affected by external factors such as the temperature. Thus, highly accurate positional control, in particular, cannot easily be achieved with a pneumatic actuator.

For this reason, a pneumatic actuator is primarily utilized in simple tasks such as a constant repetitive operation and is not deemed suitable for drive control of, for instance, an electrode, in which highly accurate positional control must be achieved in the related art.

Accordingly, an object of the present invention, which has been completed by addressing the problems discussed above, is to provide a plasma processing apparatus and an upper electrode unit with which highly accurate positional control can be implemented by using a pneumatic actuator.

In order to achieve the object described above, in a first aspect of the present invention, a plasma processing apparatus that executes plasma processing on a workpiece with plasma generated by using an electrode disposed inside a processing container, comprising a sliding support member that slidably supports the electrode with a slide mechanism so that the electrode is allowed to slide freely along one direction, a pneumatic cylinder having a rod disposed continuous with the sliding support member, a pneumatic circuit that drives the pneumatic cylinder and a means for control that implements positional control of the electrode by controlling the pneumatic circuit, is provided.

A second aspect of the present invention achieves the object by providing an upper electrode unit of a plasma processing apparatus that executes plasma processing on a workpiece with plasma generated by using an upper electrode disposed inside a processing container, comprising the upper electrode disposed inside the processing container, a sliding support member that slidably supports the upper electrode with a slide mechanism so as to allow the upper electrode to slide freely along the vertical direction, a pneumatic cylinder having a rod disposed continuous to the sliding support member, a pneumatic circuit that drives the pneumatic cylinder and a means for control that implements positional control of the upper electrode by controlling the pneumatic circuit.

According to the invention achieved in the first aspect and the second aspect by adopting the structure described above, the sliding support member provided independently of the pneumatic cylinder slidably supports the electrode so as to allow the electrode to slide freely along one direction (e.g., the vertical direction) and, as a result, any load (external disturbance) that would otherwise be applied to the pneumatic cylinder along a direction other than the one direction is eliminated to engage the pneumatic cylinder in movement along one direction exclusively. Consequently, highly accurate positional control of the electrode is achieved with the pneumatic cylinder.

In addition, by providing the upper electrode, the drive mechanism of the upper electrode and the means for its control as an integrated unit as in the second aspect, the upper electrode unit can be installed into an existing plasma processing apparatus with ease to achieve positional control for the upper electrode with a pneumatic cylinder.

The slide mechanism used in the first and second aspects may include a rail disposed at the external circumference of the sliding support member along the direction in which electrode slides and a guide member that guides the rail along the sliding direction while supporting the rail slidably and is fixed to the processing container. By adopting such a slide mechanism, the electrode card be slidably supported through a simple structure. The guide member in this slide mechanism may be fixed to the processing container via a horizontal adjustment member of the electrode. In such a case, a fine adjustment of the electrode along the horizontal direction can be achieved readily by adjusting the inclination of the guide member with the horizontal adjustment member.

Also, the rod of the pneumatic cylinder used in the first and second aspects may be disposed at an approximate center of the electrode. This structure is effective in preventing decentering of a load applied to the rod of the pneumatic cylinder and suppressing an occurrence of moment, and thus, even more accurate positional control of the electrode is achieved.

Furthermore, the pneumatic circuit used in the first and second aspects may include a switching valve provided at a position between a pneumatic source and the pneumatic cylinder, which enable drive of the rod of the pneumatic cylinder by switching the flow of compressed air supplied to the pneumatic cylinder based upon a control signal provided by the means for control and a drive stop valve disposed at a position between the switching valve and the pneumatic cylinder, which allows the rod of the pneumatic cylinder to stop and be held by cutting off the compressed air supplied to the pneumatic cylinder based upon a stop signal provided by the means for control. By adopting such a structure in the pneumatic circuit, it becomes possible to control the position to which the electrode moves and the direction along which the electrode moves with the means for control, and thus, if an abnormality occurs in the plasma processing apparatus, the movement of the electrode can be stopped and the electrode can be held at the stop position.

In addition, a means for positional detection that detects the position of the electrode by detecting the movement of the rod at the pneumatic cylinder used in the first and second aspects may be provided to allow the means for control to implement the positional control of the electrode based upon a deviation determined by subtracting the current position of the electrode detected with the means for positional detection from a target position set for the electrode. In such a case, the target position may be set over a plurality of stages leading to the position to which the electrode is to be ultimately moved, so as to drive the electrode gradually. By driving the electrode gradually in this manner, the occurrence of abrupt drive and vibration caused by material characteristics inherent to the air used to drive the pneumatic cylinder such as the viscosity and the density can be minimized. Thus, while the upper electrode is driven with the pneumatic cylinder, problems such as attracting particles and the like in the processing container, for instance, can be prevented.

It is to be noted that the electrode referred to in the description of the first aspect is one of a pair of electrodes disposed parallel to each other inside the processing container, and the workpiece may be placed on the other electrode.

The following is a detailed explanation of a preferred embodiment of the present invention, given in reference to attached drawings. It is to be noted that in the specification and the drawings, the same reference numerals are assigned to components having substantially identical functions and structural features to preclude the necessity for a repeated explanation thereof.

Figure 12:
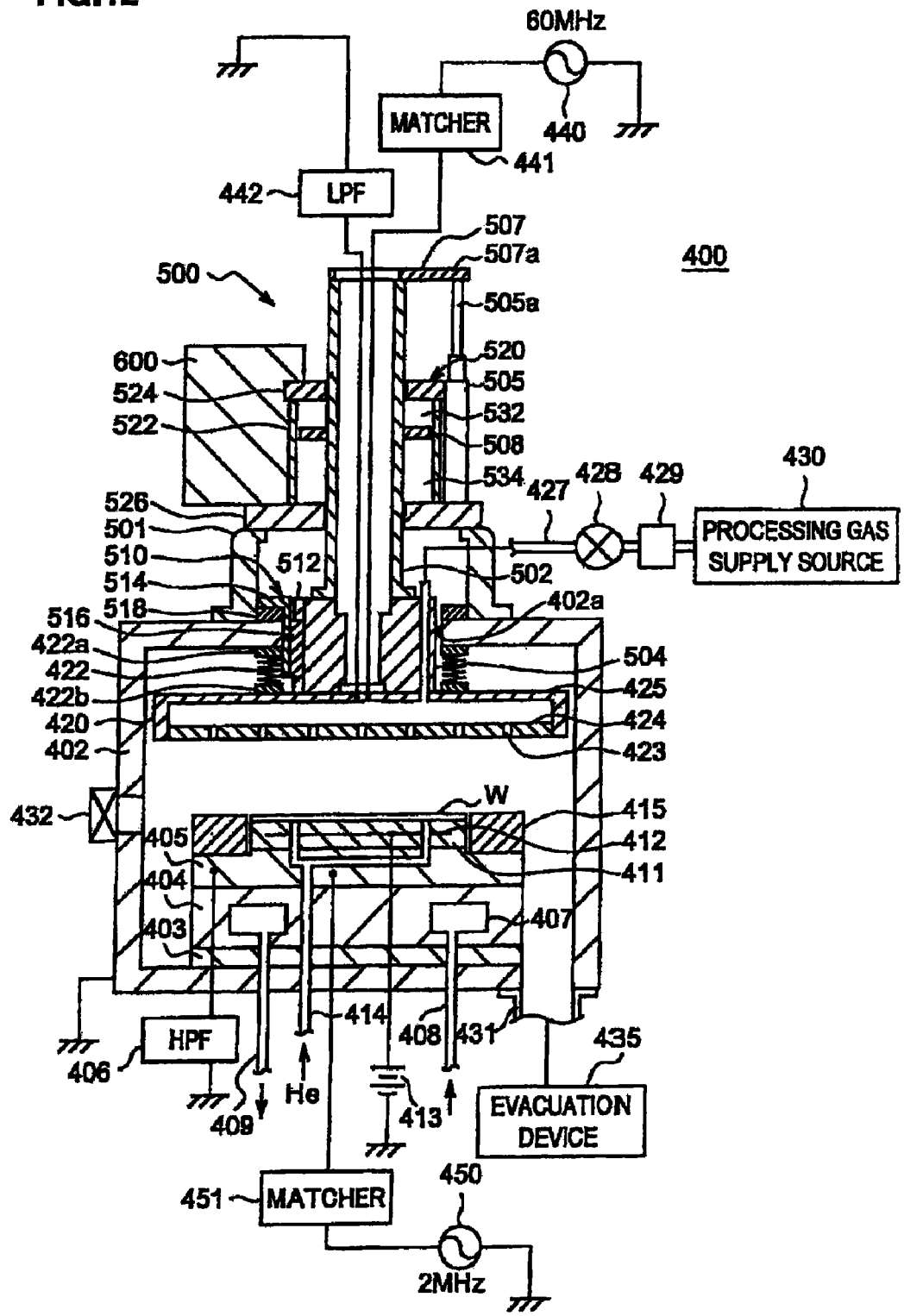
FIG. 12 is a schematic sectional view of the structure adopted in another plasma processing apparatus in which the present invention may be adopted.
Figure 13:
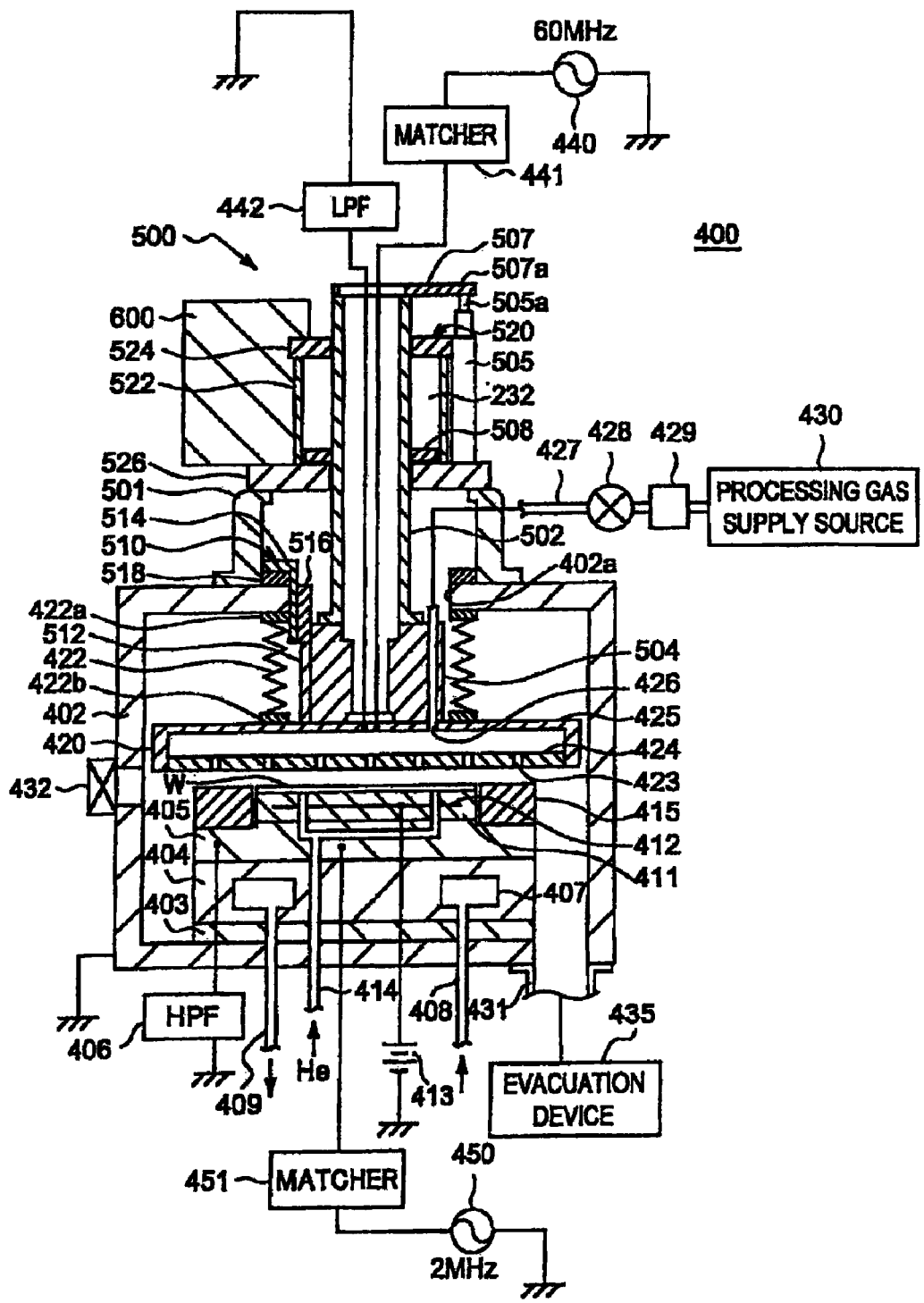
FIG. 13 is a sectional view of the plasma processing apparatus in the embodiment shown in FIG. 12 with its upper electrode set at a processing position.
Figure 14A:
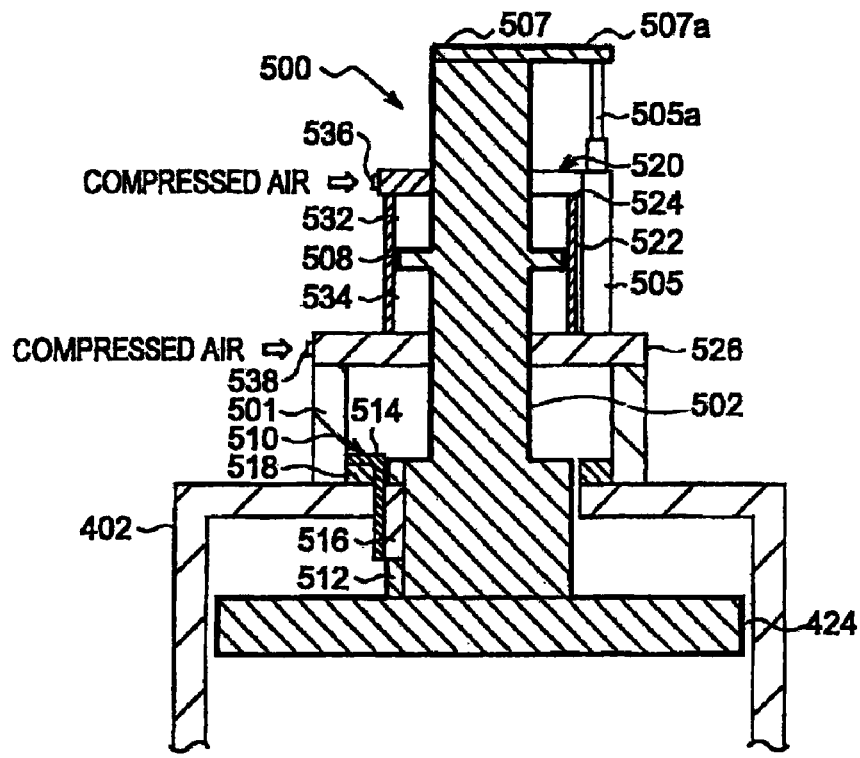
FIG. 14 presents simplified views of the upper electrode unit achieved in the embodiment, with FIG. 14A showing the upper electrode unit with the upper electrode set at a retracted position and FIG. 14B showing the upper electrode unit with the upper electrode set at the processing position.
Figure 14B:
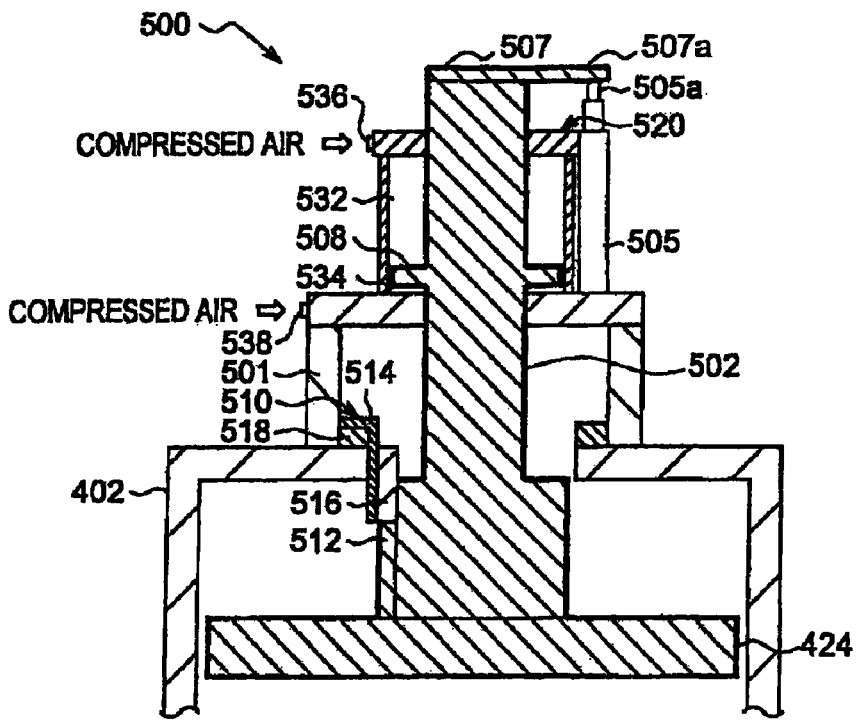

FIGS. 12 and 13 schematically illustrates the structure adopted in a plane parallel plasma processing apparatus 400, which is a typical example of the plasma processing apparatus achieved in the embodiment of the present invention. FIG. 12 shows the upper electrode set at the retracted position, whereas FIG. 13 shows the upper electrode set at the processing position. FIG. 14 schematically illustrates the mechanism used to drive the upper electrode shown in FIGS. 12 and 13 to facilitate an explanation of its functions, with FIG. 14A showing a state in which the upper electrode is set at the retracted position and FIG. 14B showing a state in which the upper electrode is set at the processing position.

The plasma processing apparatus 400 achieved in the embodiment includes a cylindrical chamber (processing container) 402 constituted of aluminum with a surface thereof having undergone anodization (alumite processing), and the chamber 402 is grounded.

A susceptor stage 404 formed in a substantially columnar shape, on which a workpiece such as a semiconductor wafer (a hereafter simply referred to as a "wafer") W is placed is provided at the bottom inside the chamber 402 via an insulating plate 403 constituted of ceramic or the like. A susceptor 405 constituting a lower electrode is set on the susceptor stage 404. A high pass filter (HPF) 106 is connected to the susceptor 405.

Inside the susceptor stage 404, a temperature adjustment medium chamber 407 is formed. A temperature adjustment medium which is guided into the temperature adjustment medium chamber 407 via a supply pipe 408 is made to circulate within the temperature adjustment medium chamber 407 and then is discharged through a discharge pipe 409. With the temperature adjustment medium circulating in this manner, the temperature of the susceptor 405 is adjusted to a desired level.

An electrostatic chuck 411 assuming a shape substantially identical to that of the wafer W is disposed on the central portion of the susceptor 405 on the upper side, which is formed as a projecting disk. The electrostatic chuck 411 is achieved by setting an electrode 412 between insulating members. A DC voltage at, for instance, 1.5 kV is applied to the electrostatic chuck 411 from a DC electrode 413 connected to the electrode 412. As a result, the wafer W becomes electrostatically held onto the electrostatic chuck 411.

At the insulating plate 403, the susceptor stage 404, the susceptor 405 and the electrostatic chuck 411, a gas passage 414 through which a heat transfer medium (e.g., a back side gas such as an He gas) is supplied to the rear surface of the workpiece i.e., the wafer W, is formed. The heat is transferred between the susceptor 405 and the wafer W via the heat transfer medium, thereby sustaining the temperature of the wafer W at a predetermined level.

An annular focus ring 415 is disposed at the edge of the susceptor 405 at its upper end so as to surround the wafer W placed on the electrostatic chuck 411. The focus ring 415 is constituted of an insulating material such as ceramic or quartz, or an electrically conductive material. The presence of the focus ring 415 improves the etching uniformity.

An evacuation pipe 431 is connected at the bottom of the chamber 402, and an evacuation device 435 is connected to the evacuation pipe 431. The evacuation device 435, which includes a vacuum pump such as a turbo molecular pump, adjusts the pressure of the atmosphere inside the chamber 402 to a predetermined lower level (e.g., 0.67 Pa or lower). In addition, a gate valve 432 is provided at the side wall of the chamber 402. As the gate valve 432 opens, a transfer of the wafer W into/out of the chamber 402 is enabled. It is to be noted that the wafer W is transferred with, for instance, a transfer arm.

In addition, an upper electrode 420 is disposed above the susceptor 405 to run parallel to the susceptor 405 and to face opposite the susceptor 405. The upper electrode 420 can be driven along one direction, e.g., the vertical direction, by an upper electrode drive mechanism 500. Thus, the distance between the susceptor 405 and the upper electrode 420 can be adjusted. It is to be noted that the upper electrode drive mechanism 500 is to be described in detail later.

The upper electrode 420 is supported at the inner wall of the ceiling of the chamber 402 via a bellows 422. The bellows 422 is mounted at the inner wall at the ceiling of the chamber 402 with a fastening means such as a bolt via an annular upper flange 422a and is also attached to the upper surface of the upper electrode 420 with a fastening means such as a bolt via an down flange 422b.

The upper electrode 420 includes an electrode plate 424 constituting a surface facing opposite the susceptor 405 and having numerous outlet holes 423 and an electrode support member 425 that supports the electrode plate 424. The electrode plate 424 is constituted of, for instance, quartz, whereas the electrode support member 425 is constituted of an electrically conductive material such as aluminum with a surface thereof having undergone alumite processing.

A gas supply port 426 is provided at the electrode support member 425 of the upper electrode 420. A gas supply pipe 427 is connected to the gas supply port 426. In addition, a processing gas supply source 430 is connected to the gas supply pipe 427 via a valve 428 and a mass flow controller 429.

An etching gas, for instance, to be used to execute plasma etching is supplied from the processing gas supply source 430. It is to be noted that while FIG. 12 shows a single processing gas supply system comprising the gas supply pipe 427, the valve 428, the mass flow controller 429, the processing gas supply source 430 and the like, the plasma processing apparatus 400 includes a plurality of processing gas supply systems in reality. Namely, CHF8, Ar and He, for instance, to constitute to the processing gas, the flow rates of which are controlled independently of one another, are individually supplied into the chamber 402.

A first high-frequency source 440 is connected to the upper electrode 420, with a first matcher 441 inserted at the power supply line. In addition, a low pass filter (LPF) 442 is connected to the upper electrode 420. The first high-frequency source 440 is capable of outputting power at a frequency in the range of 50 to 150 MHz. As the power at such a high-frequency is applied to the upper electrode 420, high-density plasma can be formed in a desired state of dissociation inside the chamber 402 and plasma processing can be executed at a lower pressure compared to the related art. Ideally, the frequency of the power output from the first high-frequency source 440 should be 50 to 80 MHz, and typically, it is adjusted to 60 MHz as shown in the figure or to a value close to 60 MHz.

A second high-frequency source 450 is connected to the susceptor 405 constituting the lower electrode, with a second matcher 451 inserted at the power supply line. The second high-frequency source 450 is capable of outputting power at a frequency in the range of several hundred kHz to several tens of MHz. As the power at a frequency in this range is applied to the susceptor 405, a desired ionization effect can be achieved without damaging the workpiece, i.e., the wafer W. Typically, the frequency of the power output from the second high-frequency source 450 is adjusted to 2 MHz, as shown in the figure, or to 13.56 MHz.

Next, the upper electrode drive mechanism 500 is explained in detail. The upper electrode drive mechanism 500 includes a substantially cylindrical sliding support member 504 that slidably supports the upper electrode 420 so as to allow the upper electrode 420 to slide relative to the chamber 402. The sliding support member 504 is mounted at an approximate center of the top surface of the upper electrode 420 with a bolt or the like.

The sliding support member 504 is disposed so that it is allowed to freely enter and withdraw from a hole 402a formed at an approximate center of the upper wall of the chamber 402. More specifically, the external circumferential surface of the sliding support member 504 is slidably supported at the edge of the hole 402a at the chamber 402 via a slide mechanism 510.

The slide mechanism 510 includes a guide member 516 retained at a vertical portion of a retaining member 514 having an L-shaped section and disposed, for instance, at the top of the chamber 402 and a rail portion 512 slidably supported by the guide member 516 and formed to extend along one direction (the vertical direction in the embodiment) at the external circumferential surface of the sliding support member 504.

The retaining member 514, which securely retains the guide member 516 of the slide mechanism 510 includes a horizontal portion fixed to the top of the chamber 402 via an annular horizontal adjustment plate 518. The horizontal adjustment plate 518 is used to adjust the horizontal position of the upper electrode 420. The horizontal adjustment plate 518 may be secured onto the chamber 402 with a plurality of bolts or the like set over uniform intervals along the circumferential direction so as to adjust the extent of inclination of the horizontal adjustment plate 518 along the horizontal direction in correspondence to the extents to which the individual bolts protrude. As the inclination of the guide member 516 at the slide mechanism 510 along the vertical direction is adjusted by adjusting the inclination of the horizontal adjustment plate 518 along the horizontal direction, the inclination of the upper electrode 420 supported via the guide member 516 is adjusted along the horizontal direction. As a result, it is possible to retain the upper electrode 420 at the correct horizontal position at all times through a simple operation.

A pneumatic cylinder 520 used to drive the upper electrode 420 is mounted on the upper side of the chamber 402 via a barrel body 501. Namely, the lower end of the barrel body 501 is mounted by assuring air tightness with a bolt or the like so as to cover the hole 402a at the chamber 402 and the upper end of the barrel body 501 is mounted by assuring air tightness at the lower end of the pneumatic cylinder 520.

The pneumatic cylinder 520 includes a rod 502 that can be driven along one direction, and the lower end of the rod 502 is disposed continuous to an approximate center area on the upper side of the sliding support member 504 with a bolt or the like. Thus, as the rod 502 of the pneumatic cylinder 520 is driven, the upper electrode 420, too, is driven by the sliding support member 504 along the slide mechanism in one direction. As the inner space of the rod 502 assuming a cylindrical shape comes into communication with a central hole formed at an approximate center of the sliding support member 504, the rod is set in a state of communication with the atmosphere. Thus, the power supply line from the matcher 441 or the like can be connected to the upper electrode 420 through the inner space of the rod 502 via the central hole at the sliding support member 504.

In addition, a means for positional detection such as a linear encoder 505 that detects the position of the upper electrode 420 is provided to the side of the pneumatic cylinder 520. An upper end member 507 having an extension 507a extending sideways from the rod 502 is provided at the upper end of the rod 502 of the pneumatic cylinder 520, and a detection portion 505a of the linear encoder 505 is in contact with the extension 507a of the upper end member 507. Since the upper end member 507 interlocks with the Movement of the upper electrode 420, the position of the upper electrode 420 can be detected with the linear encoder 505.

The pneumatic cylinder 520 is constituted by enclosing a tubular cylinder main body 522 with an upper support plate 524 and a lower support plate 526. An annular partitioning member 508 that partitions the inner space of the pneumatic cylinder 520 into an upper space 532 and a lower space 534 is disposed on the external circumferential surface of the rod 502.

As shown in FIG. 14, compressed air is supplied into the upper space 532 of the pneumatic cylinder 520 from an upper port 536 at the upper support plate 524. Compressed air is also supplied into the lower space 534 of the pneumatic cylinder 520 from a lower port 538 at the lower support plate 526. By controlling the quantities of air supplied into the upper space 532 and the lower space 534 from the upper port 536 and the lower port 538 respectively, the drive of the rod 502 along the one direction (the vertical direction in this example) can be controlled. The quantities of air supplied into the pneumatic cylinder 520 are controlled at a pneumatic circuit 610 provided near the pneumatic cylinder 520.

Figure 15:
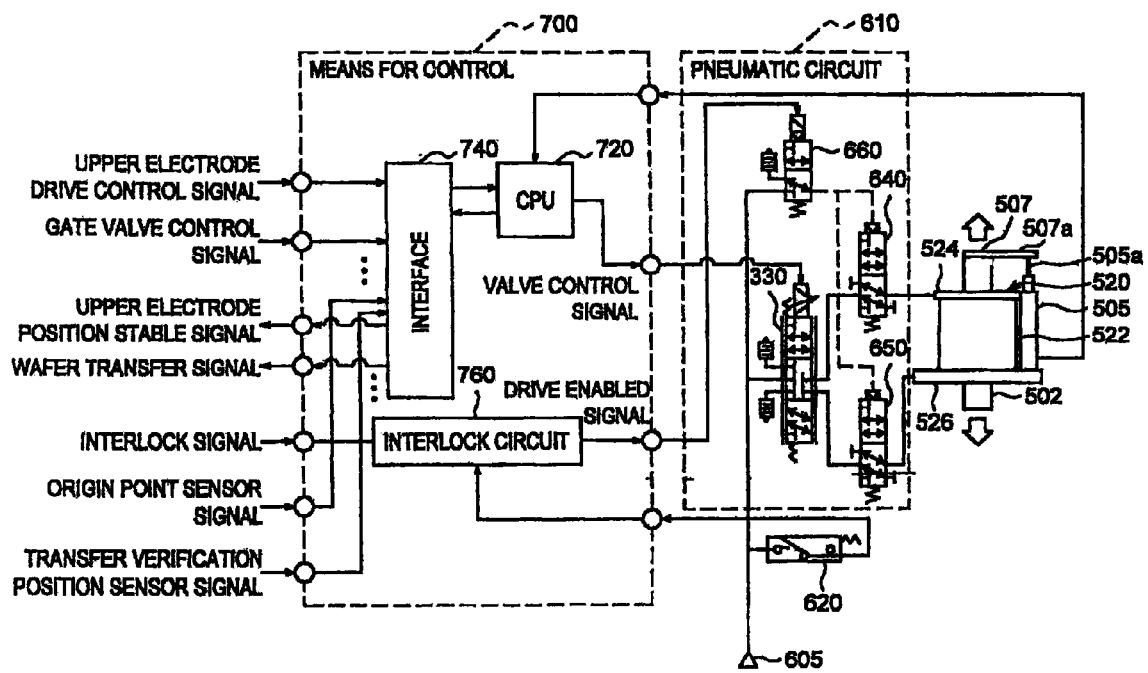
FIG. 15 shows the structure adopted in the means for drive control at the upper electrode drive mechanism in the embodiment.
Figure 16:
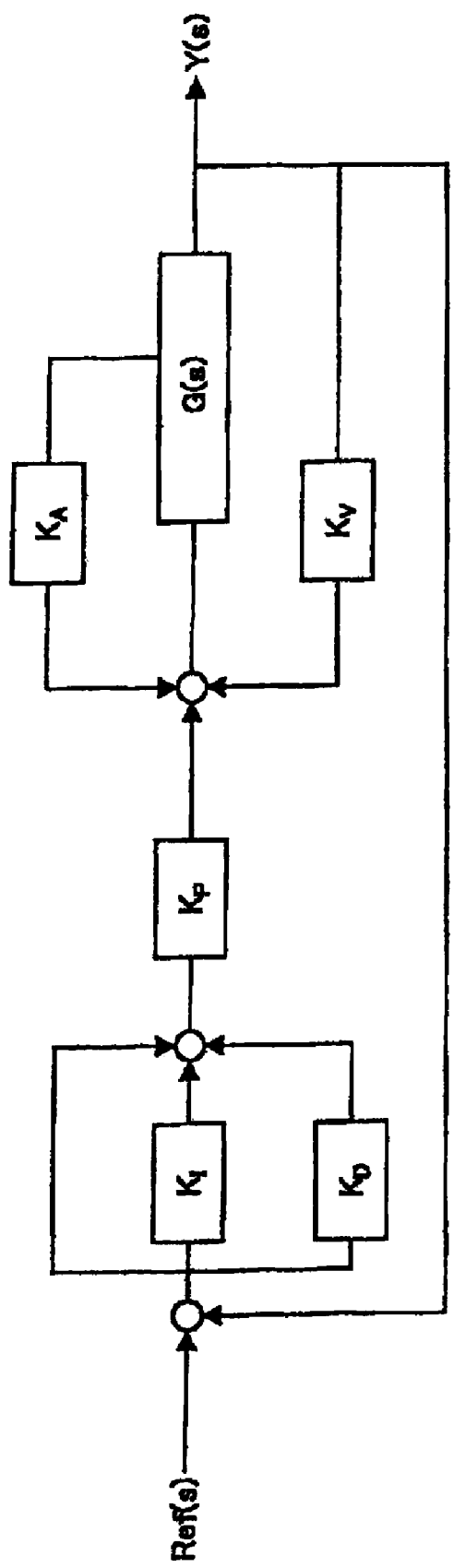
FIG. 16 is a block diagram of the upper electrode position control executed by the CPU shown in FIG. 15.

Next, a means for drive control 600 provided in the plasma processing apparatus in the embodiment as part of the upper electrode drive mechanism 500 is explained. FIG. 15 is a circuit diagram of the means for drive control 600 provided as part of the upper electrode drive mechanism 500 and FIG. 16 is a block diagram of the pneumatic circuit 610.

As shown in FIG. 15, the means for drive control 600 is constituted with the pneumatic circuit 610 and a means for control 700 that controls the pneumatic circuit 610. The means for control 700 includes a CPU (central processing unit) 720 constituting the main body of the means for control 700, an interface 740 that exchanges various signals with the external apparatuses, an interlock circuit 760 used to execute a self diagnosis of the pneumatic circuit 610 and the like. The interface 740 exchanges control signals with a control device (not shown) that controls the plasma processing apparatus 400 and also receives sensor signals from various sensors. The signals input to the interface 740 include an upper electrode drive control signal containing target position information used to drive the upper electrode 420 to a specific target position and the like, a gate valve control signal used to control the gate valve and sensor signals from the various sensors. In addition, the signals output from the interface 740 include an upper electrode position stable signal indicating whether or not the position of the upper electrode 420 has stabilized and whether or not the movement of the upper electrode 420 has been completed and a wafer transfer signal indicating whether or not the upper electrode 420 is set at a position out of the transfer path of the transfer arm transferring a wafer and thus the wafer can be safely transferred into the chamber 402.

The sensor signals include a signal from an origin point sensor that detects whether or not the upper electrode 420 is positioned at the origin point. The origin point as referred to in this context is the origin point of the means for upper electrode positional detection such as the linear encoder 505. In more specific terms, the origin point sensor may be constituted with, for instance, a contact sensor or an optical sensor. In such a case, the origin point sensor may be disposed on the inner side of the upper wall constituting the barrel body 501 on the chamber 402, and the position at which the origin point sensor detects the upper end of the sliding support member 504, i.e., the uppermost position of the upper electrode $420_0$ may be set as the origin point. Another sensor signal input to the interface 740 is a transfer verification position sensor signal inquiring whether or not the upper electrode 420 is set at a position that allows a wafer transfer. In response to the transfer verification position sensor signal input to the interface 740, the CPU 720 detects whether or not the upper electrode 420 is currently set at a position, i.e., a retracted position, at which the upper electrode 420 is out of the way of the transfer arm transferring the wafer based upon the detection signal provided by the linear encoder 505 and outputs a wafer transfer signal via the interface 740.

The interlock circuit 760, to which a signal from a switch 620 that detects whether or not compressed air is output from a pneumatic source 605 in the pneumatic circuit 610 to drive the upper electrode 420 is input, outputs a drive enabled signal to the pneumatic circuit 610 if compressed air is output from the pneumatic source 605, i.e., if the signal from the switch 620 indicates an ON state. If, on the other hand, no compressed air is output from the pneumatic source 605, i.e., if the signal from the switch 620 indicates an OFF state, it stops the output of the drive enabled signal to the pneumatic circuit 610.

In addition, the interlock circuit 760 stops the output of the drive enabled signal to the pneumatic circuit 610 if an external interlock signal is input even when the signal from the switch 620 indicates an ON state. The interlock signal is input from the control device (not shown) to the means for control 700 when, for instance, an abnormality necessitating the drive of the upper electrode 420 to be stopped occurs in the plasma processing apparatus 400.

The CPU 720 controls the pneumatic circuit 610 based upon the signals from the interface 740. It controls the movement of the upper electrode 420 so as to position the upper electrode 420 at the target position through feedback control achieved by implementing PID control (control executed by combining a proportional operation, a differential operation and an integration operation) as indicated in the block diagram in FIG. 16, for instance. In the block diagram shown in FIG. 16, Ref (s) is the target position for the upper electrode 420 and Y(s) is the current position. G(s) is the transfer function, and $K_P$, $K_I$, $K_D$, $K_A$ and $K_V$ respectively indicate the proportional gain, the integral gain, the differential gain, the acceleration feedback gain and the velocity feedback gain.

More specifically, the deviation is determined by subtracting the current position from the target position set for the upper electrode 420, and PID control is implemented based upon an output (which can be adjusted in correspondence to the integral gain $K_I$) in proportion to the time integral of the deviation and used to correct the steady state deviation, an output (which can be adjusted in correspondence to the differential gain $K_D$) in proportion to the time-varying change in the deviation and used to minimize the change rate and an output (which can be adjusted in correspondence to the proportional gain $K_P$) in proportion to the deviation. Namely, in this PID control, a function of predicting the movement which is in proportion to the current deviation (a proportional operation), a function of eliminating the offset by holding the integral of the previous deviation (an integration operation) and a function of predicting future movement (a differential operation) are incorporated.

In addition, the pneumatic circuit 610 is controlled in the embodiment through the acceleration feedback control, implemented based upon outputs from pressure sensors (not shown) disposed at the ports 536 and 538 of the pneumatic cylinder 520 in order to control the external disturbance, as shown in FIG. 16, and the velocity feedback control implemented based upon the output of the linear encoder 505 taken into the means for control 700, as shown in FIG. 15.

The positional control of the upper electrode 420 may be achieved by setting the target position over a plurality of stages preceding the ultimate position to which the upper electrode 420 is to be moved and by driving the upper electrode 420 gradually. In this case, abrupt drive or abrupt vibration attributable to material properties such as the viscosity and the density of the air used to drive the pneumatic cylinder can be minimized. As a result, problems of attracting particles inside the chamber 402 and the like while driving the upper electrode with a pneumatic cylinder do not occur.

Figure 17:
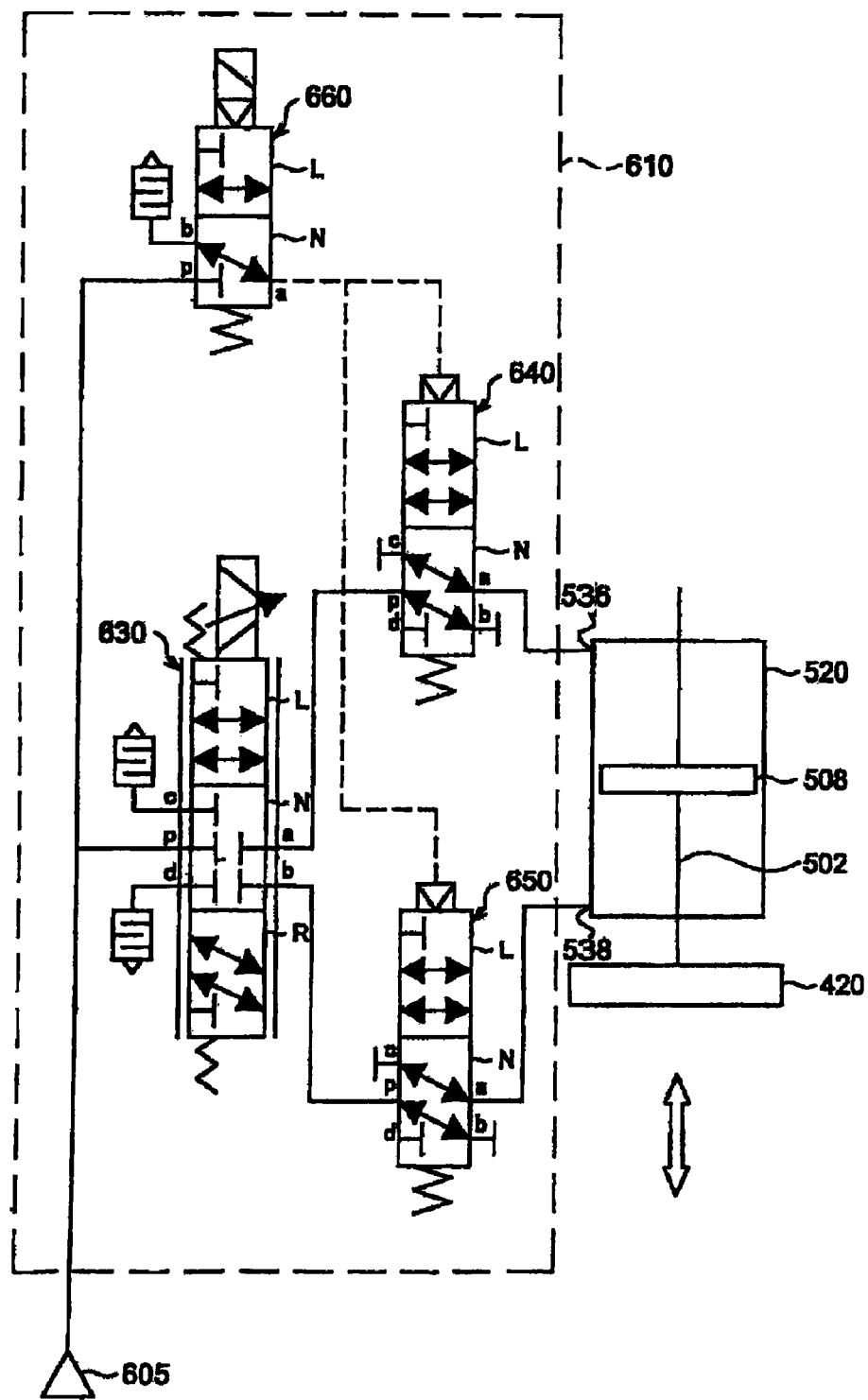
FIG. 17 shows the structure adopted in the pneumatic circuit in the embodiment.
Figure 18:
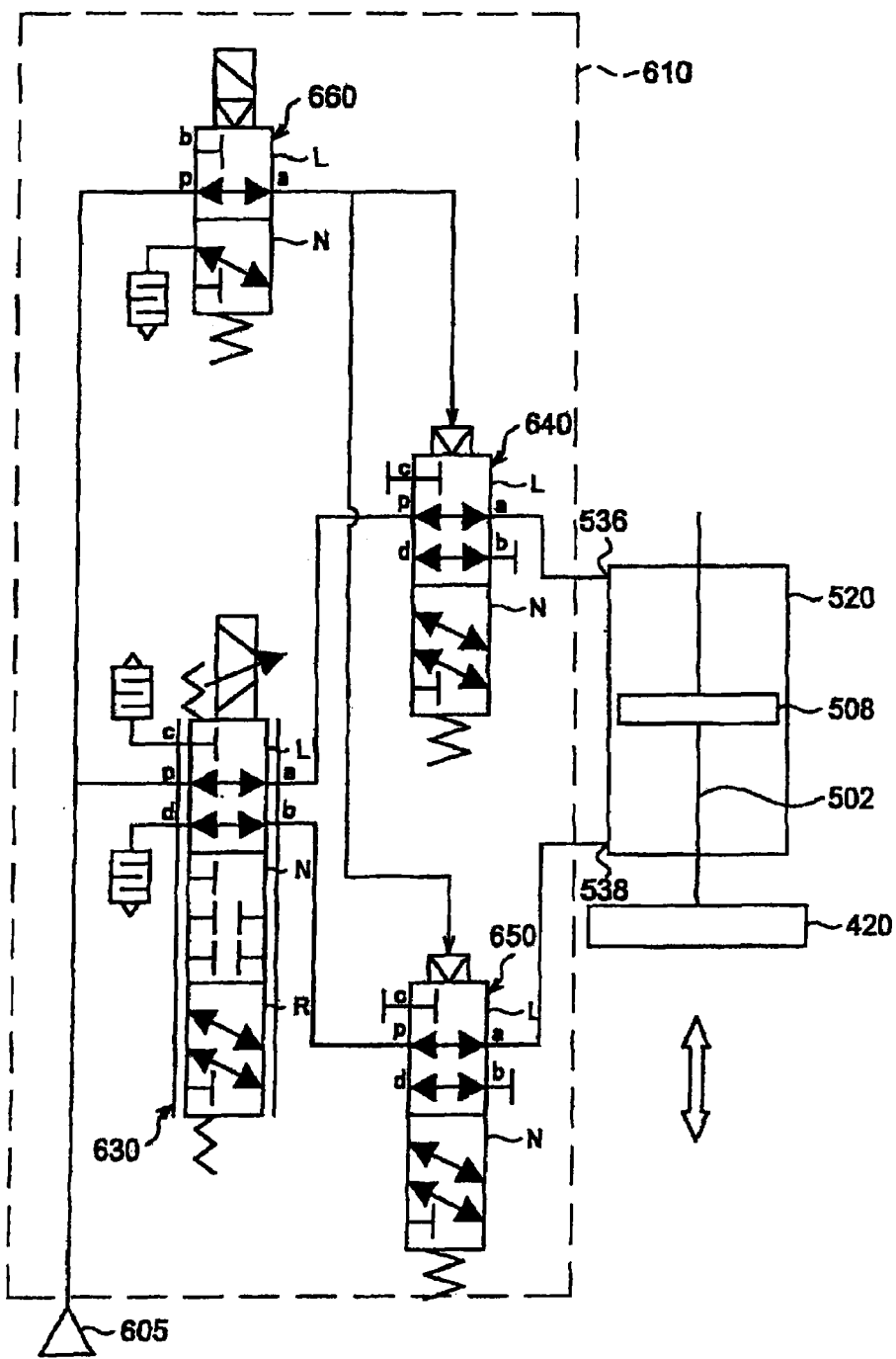
FIG. 18 illustrates the functions of the pneumatic circuit in the embodiment.
Figure 19:
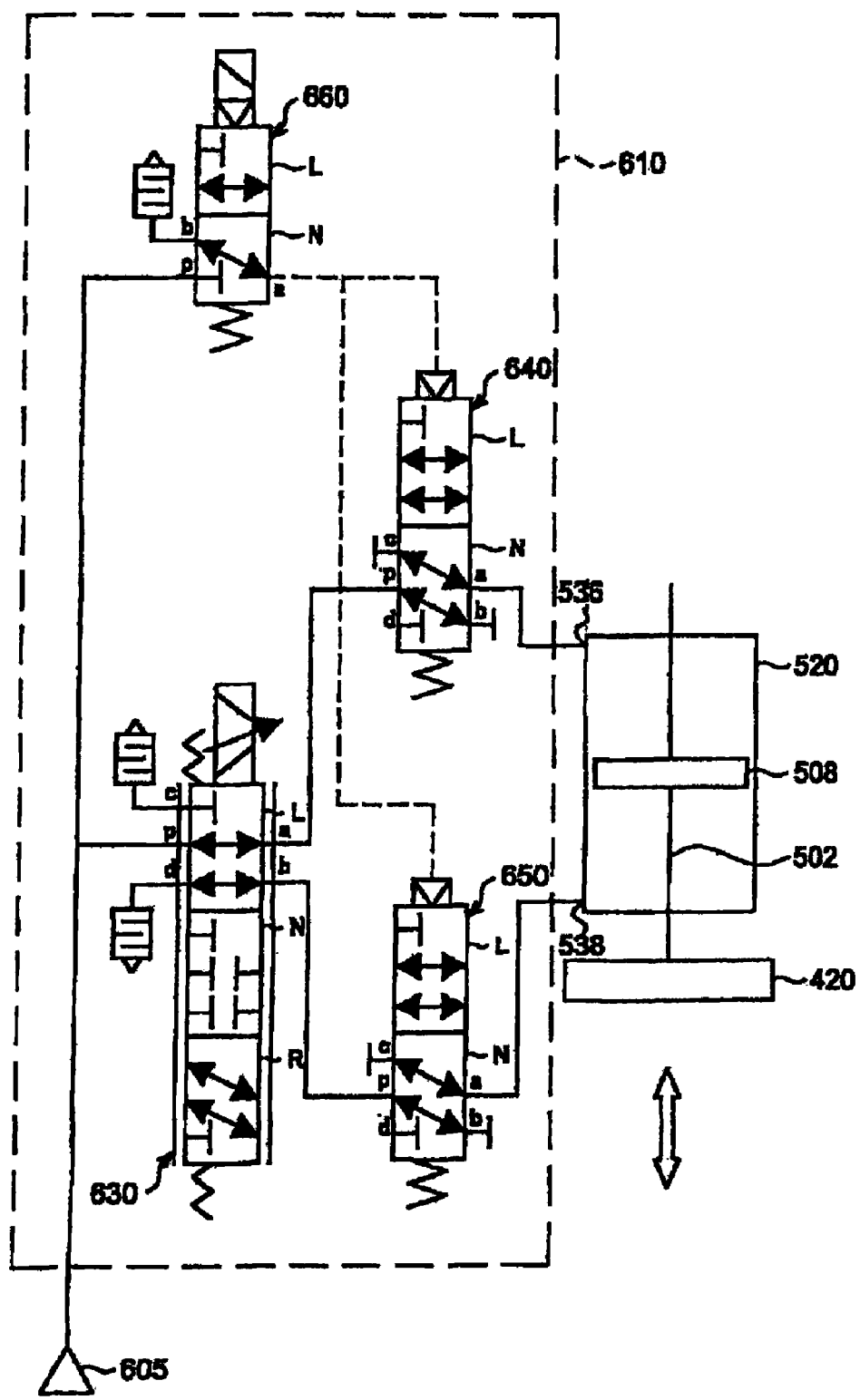
FIG. 19 illustrates the functions of the pneumatic circuit in the embodiment.

A structural example that may be adopted in the pneumatic circuit 610 is now explained. FIG. 17 is a circuit diagram of a structure that may be adopted in the pneumatic circuit 610. FIGS. 18 and 19 are functional diagrams illustrating the operation of the pneumatic circuit 610. The pneumatic circuit 610 is in a neutral state in FIG. 17, is engaged in the drive control of the upper electrode 420 in FIG. 18 and is in a state of emergency stop in FIG. 19.

As shown in FIGS. 15 and 17, the pneumatic circuit 610 includes a 5-port electromagnetic valve 630 constituting a switching valve capable of switching the flow path to a neutral state or a drive control state in response to a valve control signal provided by the CPU 720. A 5-port switching valve 640 is disposed in a pipeline extending from the 5-port electromagnetic valve 630 and communicating with the upper port 536 of the pneumatic cylinder 520, and a 5-port switching valve 650 is disposed in the pipeline extending from the 5-port electromagnetic valve 630 and communicating with the lower port 538 of the pneumatic cylinder 520. These 5-port switching valves 640 and 650, each used as a drive stop valve when effecting an emergency stop of the pneumatic cylinder 520, can be controlled with a 3-port electromagnetic valve 660.

Now, the specific relationship with which the individual valves are connected with each other is explained. The pneumatic source 605 is connected to a p-port of the 5-port electromagnetic valve 630, and an a-port of the 5-port electromagnetic valve 630 is connected to a p-port of the 5-port switching valve 640. In addition, a b-port of the 5-port electromagnetic valve 630 is connected to a p-port of the 5-port switching valve 650. A c-port and a d-port of the 5-port electromagnetic valve 630 are used as discharge ports.

With the 5-port electromagnetic valve 630, the flow path can be switched to an N state, an L state or an R state. A force applying member such as a spring is disposed on each side of the 5-port electromagnetic valve 630, and a force is applied to the 5-port electromagnetic valve 630 to set it in the N state unless power is supplied in response to a valve control signal provided by the means for control 700. Then, if positive power is supplied in response to the valve control signal, for instance, the 5-port electromagnetic valve 630 is set in the L state against the force applied by the force applying members, whereas if negative power is applied in response to the valve control signal, the 5-port electromagnetic valve 630 is set in the R state against the force applied by the force applying members. When the 5-port electromagnetic valve 630 is in the N state, each port at the 5-port electromagnetic valve 630 is in a cut-off state. When the 5-port electromagnetic valve 630 is in the L state, its p-port and a-port are connected with each other and its d-port and b-port are connected with each other, whereas when the 5-port electromagnetic valve 630 is in the R state, its p-port and b-port are connected with each other and its c-port and a-port are connected with each other.

The upper port 536 of the pneumatic cylinder 520 is connected to an a-port of the 5-port switching valve 640 whereas the lower port 538 is connected to an a-port of the 5-port switching valve 650. With both the 5-port switching valve 640 and the 5-port switching valve 650, the flow path can be switched to either the N state or the L state. At each of the 5-port switching valves 640 and 650, a force applying members such as a spring is provided on one side thereof to apply a force to the 5-port switching valve to set it in the N state unless compressed air is supplied through the 3-port electromagnetic valve 660. As compressed air is supplied through the 3-port electromagnetic valve 660, the 5-port switching valves enter the L state against the force applied by the force applying members. At each of the 5-port switching valves 640 and 650, the p-port and a b-port are connected with each other and a c-port and the a-port are connected with each other in the N state, and the p-port and the a-port are connected with each other and the d-port and the b-port are connected with each other in the L state.

The pneumatic source 605 is connected to a p-port of the 3-port electromagnetic valve 660, and a b-port and an a-port at the 3-port electromagnetic valve 660 are connected with each other. It is to be noted that the b-port at the 3-port electromagnetic valve 660 is used as a discharge port. As shown in FIG. 15, the flow path is switched to either the N state or the L state at the 3-port electromagnetic valve 660 based upon the drive enabled signal provided by the interlock circuit 760. A force applying member such as a spring is provided on one side of the 3-port electromagnetic valve 660 and a force is applied to set the 3-port electromagnetic valve 660 in the N state unless power is supplied in response to the drive enabled signal provided by the means for control 700. Then, as the drive enabled signal is output, it enters the L state against the force applied by the force applying member. At the 3-port electromagnetic valve 660, the p-port is cut off and the b-port and the a-port are connected with each other in the N state, whereas the p-port and the a-port are connected with each other and the b-port is cut off in the L state.

When the switch 620 of the pneumatic source 605 is in an OFF state, as shown in FIG. 17, the output of the drive enabled signal from the interlock circuit 760 is stopped and thus, the flow path at the 3-port electromagnetic valve 660 is in the N state and the flow path at the 5-port electromagnetic valve 630, too, is in the N state in the pneumatic circuit 610 adopting the structure described above. In this neutral state, the ports 536 and 538 at the pneumatic cylinder 520 are cut off from the pneumatic source 605 by the 5-port electromagnetic valve 630, and, as a result, the upper electrode 420 is held in a stopped state.

As the switch 620 of the pneumatic source 605 is turned on, the drive enabled signal is output from the interlock circuit 760, thereby setting the flow path at the 3-port electromagnetic valve 660 in the L state. As a result, the flow path at the 5-port switching valves 640 and 650 each enter the L state. Consequently, drive of the upper electrode 420 is enabled with the compressed air supplied to the pneumatic cylinder 520 by switching the flow path at the 5-port electromagnetic valve 630.

When the upper electrode 420 is to move downward, for instance, from this state, the flow path at the 5-port electromagnetic valve 630 is set in the L state, as shown in FIG. 18. In response, the compressed air from the pneumatic source 605 is guided in through the upper port 536 at the pneumatic cylinder 520 and is discharged through the lower port 538, causing the sliding support member 504 to move downward and ultimately causing the upper electrode 420 to move downward.

When the upper electrode 420 is to move upward, for instance, from the neutral state shown in FIG. 17, the flow path at the 5-port electromagnetic valve 630 is set in the N state unlike in the operation shown in FIG. 18. As the stop signal from the interlock circuit 760 enters the OFF state, the flow path at the 3-port electromagnetic valve 660 is set in the L state under these circumstances as well. As a result, the flow paths at both the 5-port switching valve 640 and the 5-port switching valve 650 are set in the L state. In response, the compressed air from the pneumatic source 605 is guided in through the lower port 538 at the pneumatic cylinder 520 and then discharged through the upper port 536, causing the sliding support member 504 to move upward and ultimately causing the upper electrode 420 to move upward.

FIG. 19 shows the state of the pneumatic circuit 610 when an emergency stop is applied while driving the upper electrode. As the stop signal from the interlock circuit 760 is turned on, the flow path at the 3-port electromagnetic valve 660 enters the N state. As a result, the flow paths at the 5-port switching valves 640 and 650 both enter the N state. In response, the compressed air from the pneumatic source 605 is guided through the lower port 538 at the pneumatic cylinder 520, and the compressed air from the pneumatic source 605 is cut off from both the upper part 536 and the lower port 538 at the pneumatic cylinder 520, thereby stopping the sliding support member 504 and stopping the upper electrode 420.

Figure 20:
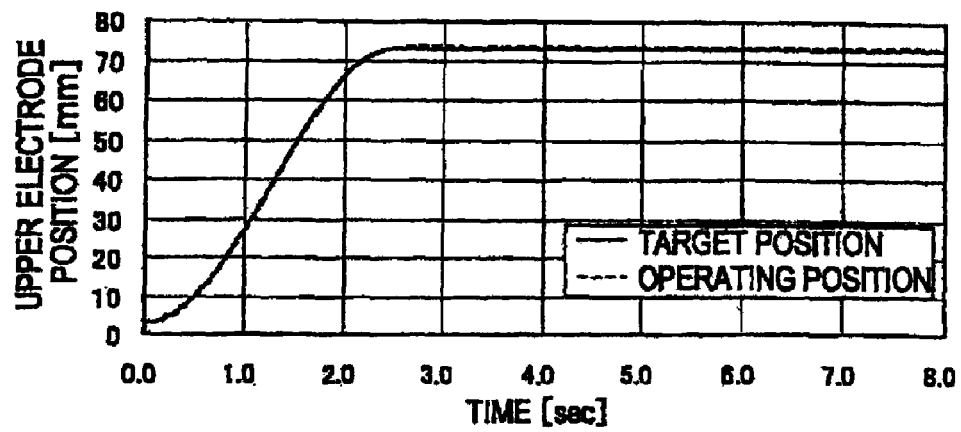
FIG. 20 shows the results of position control achieved by driving the upper electrode in the embodiment upward.
Figure 21:
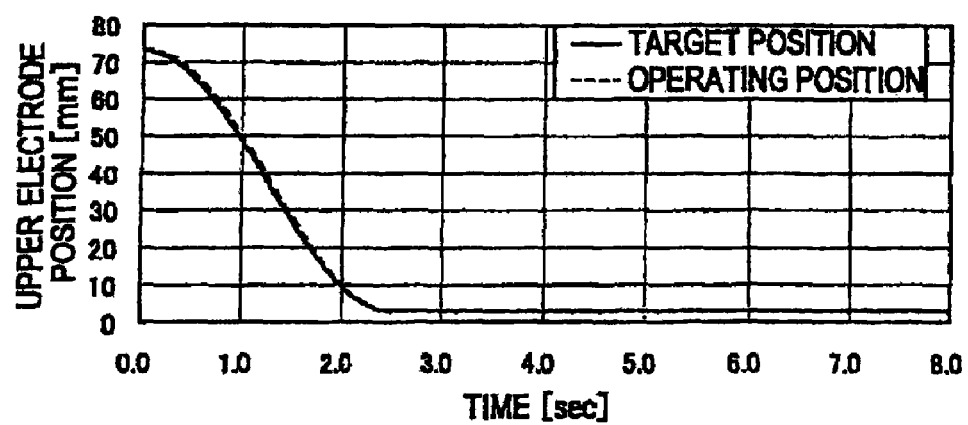
FIG. 21 shows the results of position control achieved by driving the upper electrode in the embodiment downward.

FIGS. 20 and 21 present the results of tests conducted by implementing the specific control shown in FIG. 16 with the pneumatic circuit 610 achieved in the embodiment as described above with the target position set over a plurality of stages preceding the ultimate position to which the upper electrode 420 was to move. FIG. 20 is a graph of the relationship between the position of the upper electrode 420 and the time observed by gradually driving the upper electrode 420 upward, whereas FIG. 21 is a graph of the relationship between the position of the upper electrode 420 and the time, observed by gradually driving the upper electrode 420 downward. FIGS. 20 and 21 indicate that stable and accurate follow-up control was achieved to drive the upper electrode 420 upward or downward to set the target position.

Various indices measured based upon these test results, which include approximately ±0.15 mm representing the accuracy with which the upper electrode was stopped and approximately 60 mm/sec representing the operating speed, indicate that the structure adopted in the embodiment is highly viable in practical application. In other words, highly accurate positional control is enabled by employing the plasma processing apparatus 400

In the plasma processing apparatus in the embodiment described in detail above, the sliding support member 504 is provided independently of the pneumatic cylinder 520 to slidably support the upper electrode 420 along one direction (e.g., the vertical direction), and thus, any load (external disturbance) that would be applied to the pneumatic cylinder 520 along a direction other than the one direction is eliminated to allow the pneumatic cylinder 520 to move only along the one direction. Consequently, the positional control for the upper electrode 420 can be implemented with a high degree of accuracy with the pneumatic cylinder 520.

The rod 502 at the pneumatic cylinder 520 is disposed at an approximate center of the upper electrode 420 to prevent decentering of the load applied to the rod 502 at the pneumatic cylinder 520 and the occurrence of a moment and, as a result, the position of the electrode can be controlled with an even higher degree of accuracy.

It is to be noted that while the upper electrode 420 is driven by using the pneumatic cylinder 520 in the embodiment described above, the lower electrode may instead be slidably supported and be driven with the pneumatic cylinder 520. However, at the lower electrode on which the workpiece such as a wafer or a liquid crystal substrate is placed, various additional mechanisms including a workpiece holding mechanism, a workpiece back side gas mechanism and an electrode temperature adjustment mechanism must be mounted, whereas the upper electrode does not need such additional mechanisms. For this reason, a higher degree of positional control accuracy can be achieved for the upper electrode 420 by driving the upper electrode 420 with the pneumatic cylinder and thus minimizing the load applied to the rod 502 at the pneumatic cylinder 520.

In addition, the components such as the upper electrode 420, the upper electrode drive mechanism 500 for the upper electrode 420, the pneumatic circuit 610 and the means for control 700 may be provided as an integrated upper electrode unit, as shown in FIG. 14, to facilitate positional control to be implemented with a pneumatic cylinder on an upper electrode 420 in an existing plasma processing apparatus simply by installing the upper electrode unit.

In conjunction with the plasma processing apparatus and the upper electrode unit described above, highly accurate positional control can be achieved with a pneumatic cylinder functioning as a pneumatic actuator by minimizing the load applied to the pneumatic cylinder.

It is to be noted that while an explanation is given above in reference to the embodiment on an example in which the present invention is adopted in a plasma etching apparatus, the present invention may instead be adopted in a different type of processing apparatus such as a film forming apparatus or an ashing apparatus. In addition, while the workpiece processed in the embodiment described above is a semiconductor wafer, the present invention is not limited to this example, and the present invention may be adopted to process a workpiece such as a glass substrate for a flat display (FPD) in a liquid crystal display (LCD) device, i.e., an FPD substrate which may be an LCD substrate.

What is claimed is:

1. A plasma processing apparatus that executes plasma processing on a workpiece disposed inside a processing container, the plasma processing apparatus comprising:
    an electrode disposed inside the processing container;
    a sliding support member that slidably supports the electrode with a slide mechanism so as to allow the electrode to slide freely along any direction;
    a pneumatic cylinder having a rod disposed continuous to the sliding support member;
    a pneumatic circuit that drives the pneumatic cylinder; and
    a means for control that implements positional control of the electrode by controlling the pneumatic circuit, wherein the slide mechanism comprises:
        a rail disposed at the external circumference of the sliding support member along the direction in which the electrode slides; and
        a guide member that guides the rail along the sliding direction while supporting the rail slidably and is fixed to the processing container.

2. The plasma processing apparatus according to claim 1, wherein:
    the guide member is fixed to the processing container via a horizontal adjustment member of the electrode.

3. The plasma processing apparatus according to claim 1, wherein:
    the rod of the pneumatic cylinder is disposed at an approximate center of the electrode.

4. The plasma processing apparatus according to claim 1, wherein:
    the pneumatic circuit includes;
    a switching valve provided at a position between a pneumatic source and the pneumatic cylinder, which enable drive of the rod of the pneumatic cylinder by switching the flow of compressed air supplied to the pneumatic cylinder based upon a control signal provided by the means for control; and
    a drive stop valve disposed at a position between the switching valve and the pneumatic cylinder, which allows the rod of the pneumatic cylinder to stop and be held by cutting off the compressed air supplied to the pneumatic cylinder based upon a stop signal provided by the means for control.

5. The plasma processing apparatus according to claim 1, further comprising:
    a means for positional detection that detects the position of the electrode by detecting the movement of the rod at the pneumatic cylinder; and wherein:
    the means for control implements the positional control of the electrode based upon a deviation determined by subtracting the current position of the electrode detected with the means for positional detection from a target position set for the electrode.

6. The plasma processing apparatus according to claim 5, wherein:
    the means for control sets the target position over a plurality of stages leading to the position to which the electrode is to be ultimately moved, so as to drive the electrode gradually.

7. The plasma processing apparatus according to claim 1, wherein:
    the electrode is one of a pair of electrodes disposed parallel to each other inside the processing container; and
    the workpiece is placed on the other electrode.

8. An upper electrode unit of a plasma processing apparatus that executes plasma processing on a workpiece disposed inside a processing container, the upper electrode unit comprising:
    an upper electrode disposed inside the processing container;
    a sliding support member that slidably supports the upper electrode with a slide mechanism so as to allow the upper electrode to slide freely along any direction;
    a pneumatic cylinder having a rod disposed continuous to the sliding support member;
    a pneumatic circuit that drives the pneumatic cylinder; and
    a means for control that implements positional control of the upper electrode by controlling the pneumatic circuit, wherein the slide mechanism comprises:
        a rail disposed at the external circumference of the sliding support member along the direction in which upper electrode slides; and
        a guide member that guides the rail along the sliding direction while supporting the rail slidably and is fixed to the processing container.

9. The upper electrode unit according to claim 8, wherein:
    the guide member is fixed to the processing container via a horizontal adjustment member of the upper electrode.

10. The upper electrode unit according to claim 8, wherein:
    the rod of the pneumatic cylinder is disposed at an approximate center of the upper electrode.

11. The upper electrode unit according to claim 8, wherein:
    the pneumatic circuit includes;
    a switching valve provided at a position between a pneumatic source and the pneumatic cylinder, which enable drive of the rod of the pneumatic cylinder by switching the flow of compressed air supplied to the pneumatic cylinder based upon a control signal provided by the means for control; and
    a drive stop valve disposed at a position between the switching valve and the pneumatic cylinder, which allows the rod of the pneumatic cylinder to stop and be held by cutting off the compressed air supplied to the pneumatic cylinder based upon a stop signal provided by the means for control.

12. The upper electrode unit according to claim 8, further comprising:
  a means for positional detection that detects the position of the upper electrode by detecting the movement of the rod at the pneumatic cylinder; and wherein:
  the means for control implements the positional control of the upper electrode based upon a deviation determined by subtracting the current position of the upper electrode detected with the means for positional detection from a target position set for the upper electrode.

13. The upper electrode unit according to claim 12, wherein:
  the means for control sets the target position over a plurality of stages leading to the position to which the upper electrode is to be ultimately moved, so as to drive the upper electrode gradually.

* * * * *